United States Patent [19]

Young

[11] Patent Number: 5,047,974
[45] Date of Patent: * Sep. 10, 1991

[54] CELL BASED ADDER WITH TREE STRUCTURED CARRY, INVERTING LOGIC AND BALANCED LOADING

[75] Inventor: William R. Young, Palm Bay, Fla.

[73] Assignee: Harris Corporation, Melbourne, Fla.

[*] Notice: The portion of the term of this patent subsequent to Nov. 21, 2006 has been disclaimed.

[21] Appl. No.: 124,807

[22] Filed: Nov. 24, 1987

[51] Int. Cl.⁵ .............................................. G06F 7/50
[52] U.S. Cl. ..................................... 364/784; 364/787
[58] Field of Search ............................... 364/788–786, 364/784, 768

[56] References Cited

U.S. PATENT DOCUMENTS

| | | | |
|---|---|---|---|
| 3,100,835 | 8/1963 | Bedrij | 364/788 |
| 3,993,891 | 11/1976 | Beck et al. | 364/788 X |
| 4,163,211 | 7/1979 | Miura | 364/787 X |
| 4,464,729 | 8/1984 | Mlynek | 364/787 |
| 4,600,864 | 7/1986 | Burrows | 364/784 X |
| 4,623,981 | 11/1986 | Wolrich et al. | 364/787 X |
| 4,700,325 | 10/1987 | Ware | 364/784 X |
| 4,764,886 | 8/1988 | Yano | 364/787 |
| 4,882,698 | 11/1989 | Young | 364/787 X |

OTHER PUBLICATIONS

Bachade, R. A., et al.; "Inverted Carry Propagation Chain"; *IBM Technical Disclosure Bulletin*; vol. 25, No. 4; Sep. 1982; pp. 1818–1819.

*Primary Examiner*—Benny Lee
*Attorney, Agent, or Firm*—Evenson, Wands, Edwards, Lenahan & McKeown

[57] ABSTRACT

An adder comprising a tree-based carry structure, wherein the maximum fanout from any gate in the carry structure is three. When calculating optimized fanout, it is necessary to consider input capacitance to the following stage. In minimizing propagation delay, it is necessary to consider loading and the number of stages. It has been recognized that optimum fanout of e results in optimized propagation through the adder, thus fanout of three is the closest whole number. A cell has been designed which includes the necessary and sufficient circuitry for building multicell adders in a highly optimized structure. The cell provides individually accessible components and dedicated components for optimum layout in the end product.

37 Claims, 18 Drawing Sheets

EXCLUSIVE OR

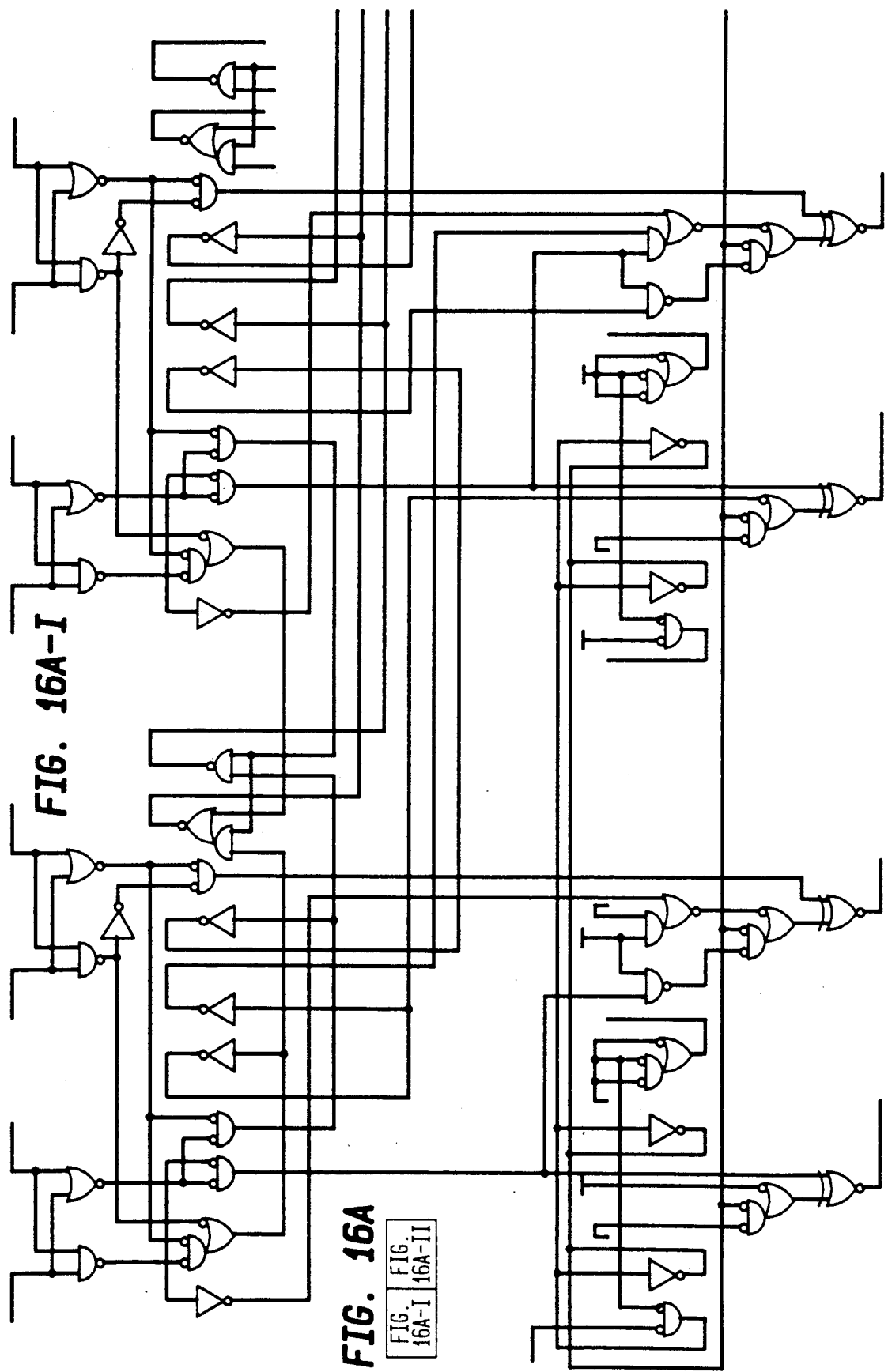

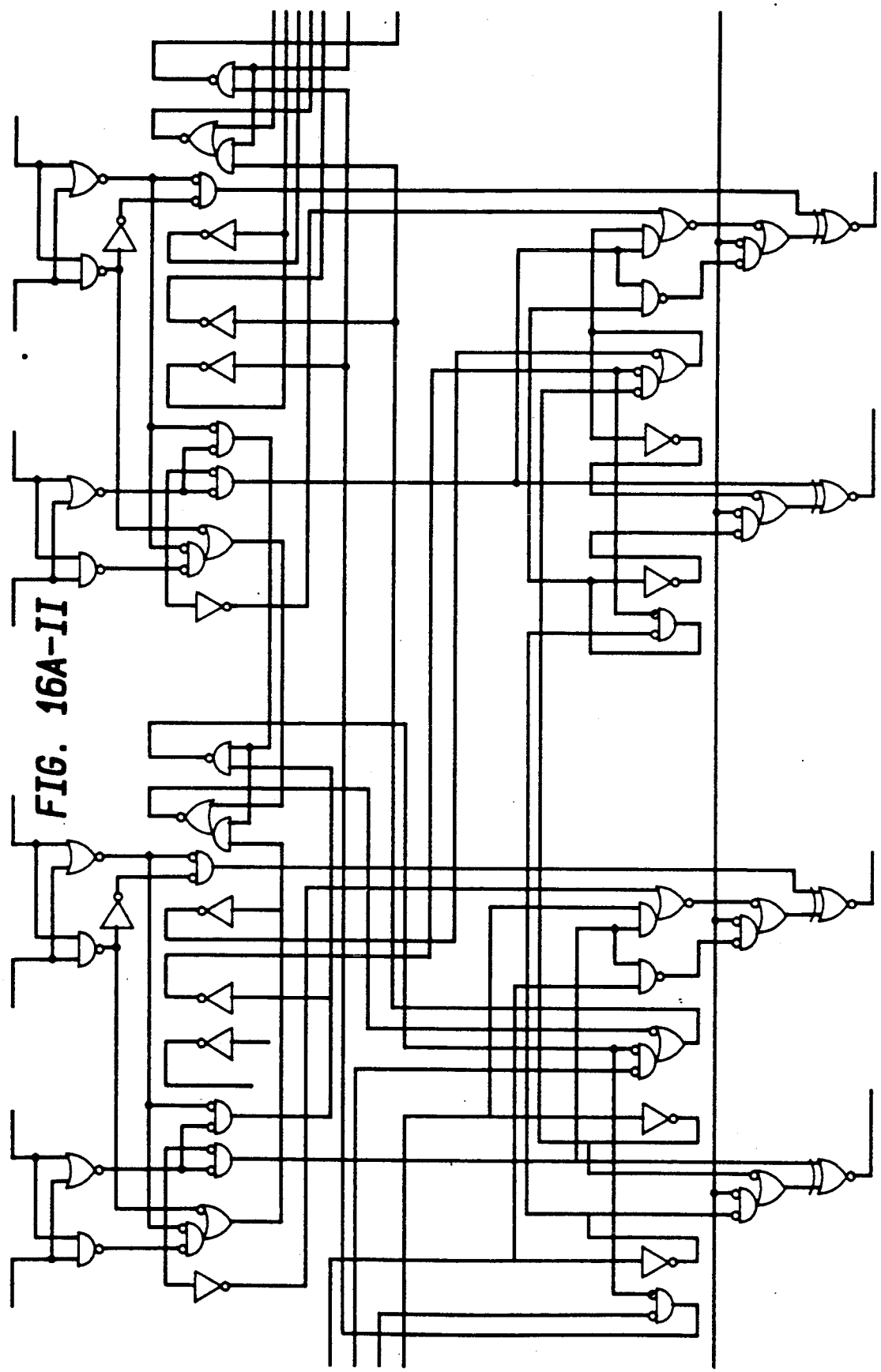
FIG. 16A-II

FIG. 16B-I

| FIG. 16B-I | FIG. 16B-II |

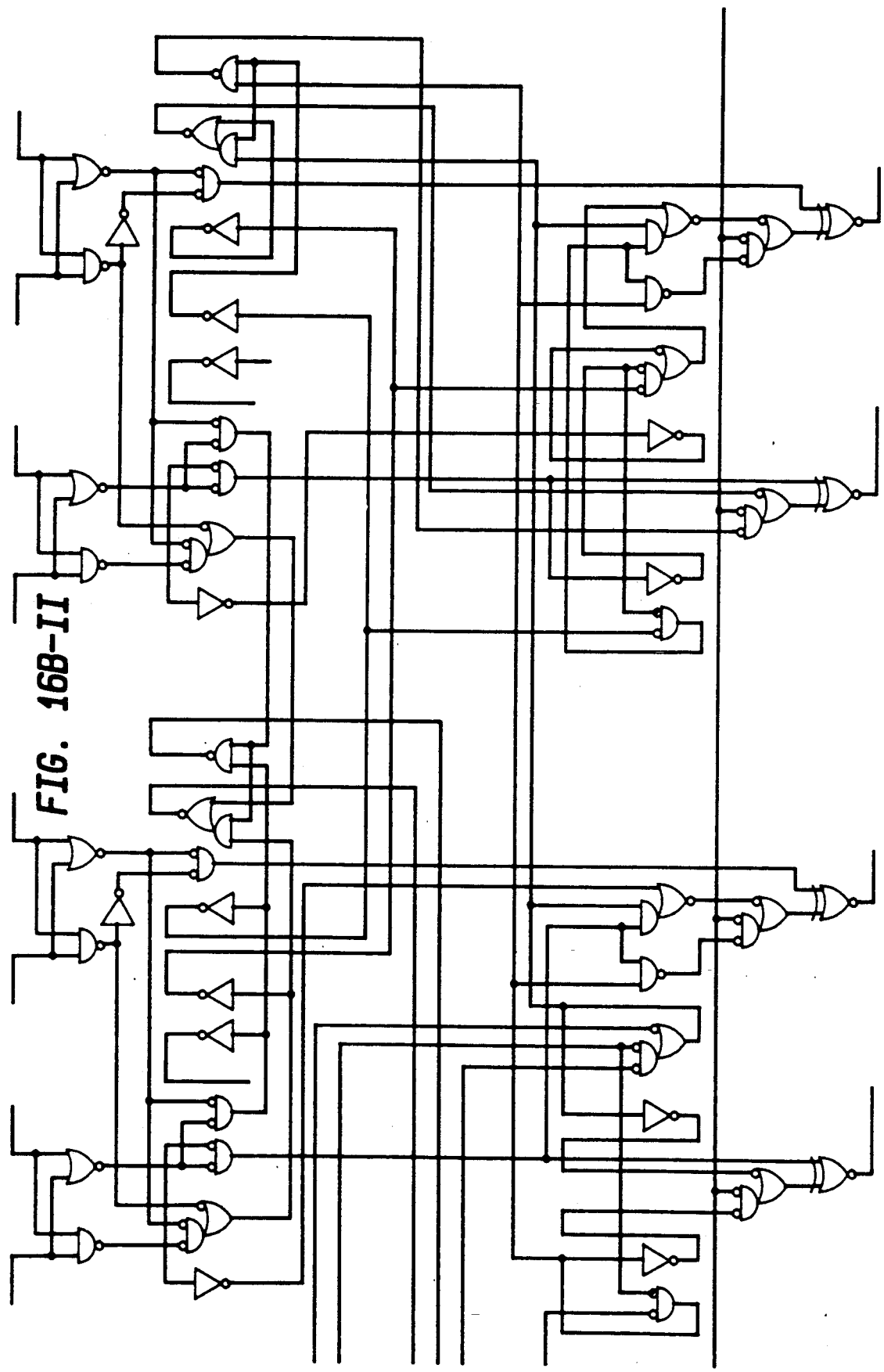
FIG. 16B-II

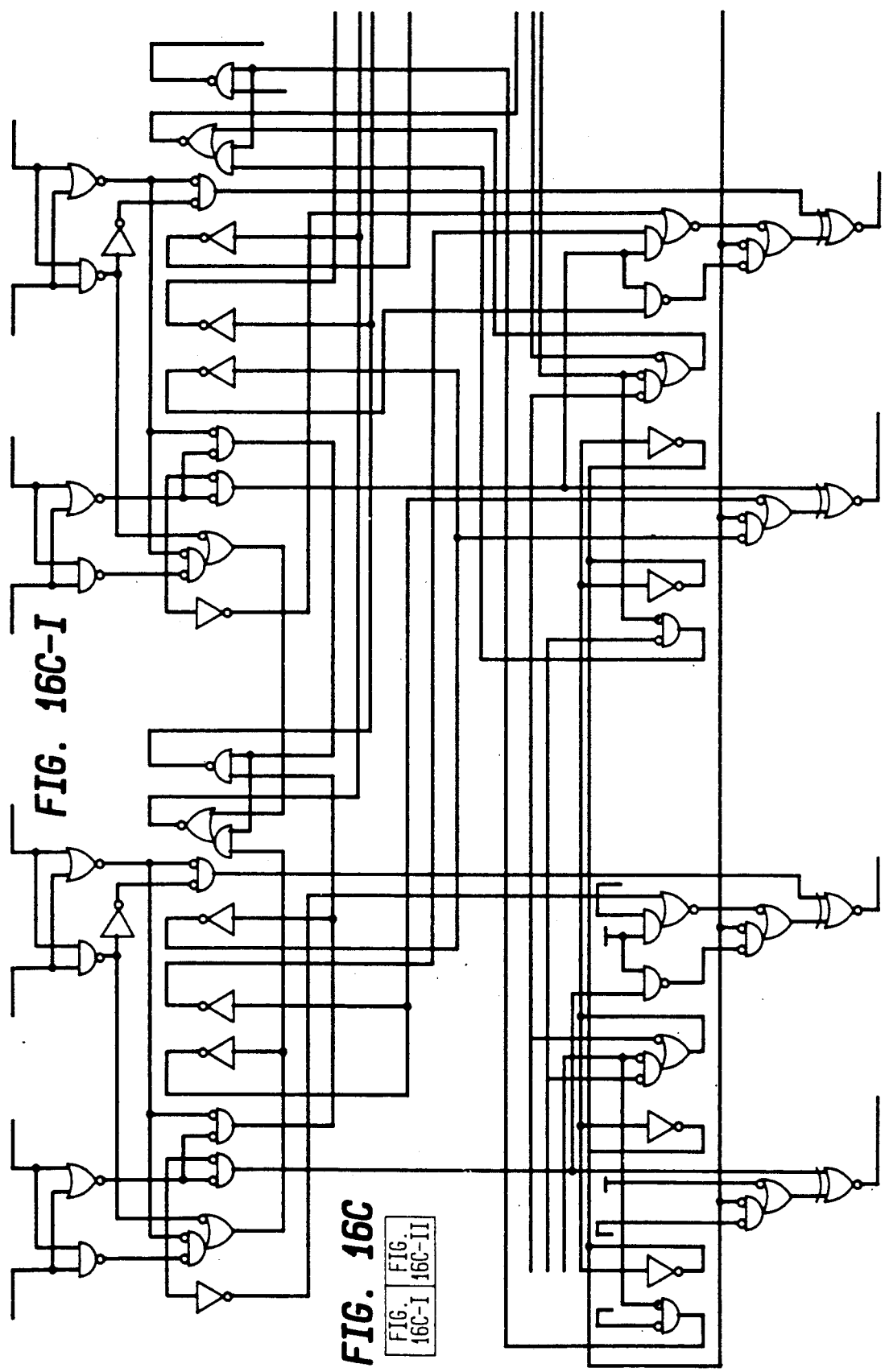

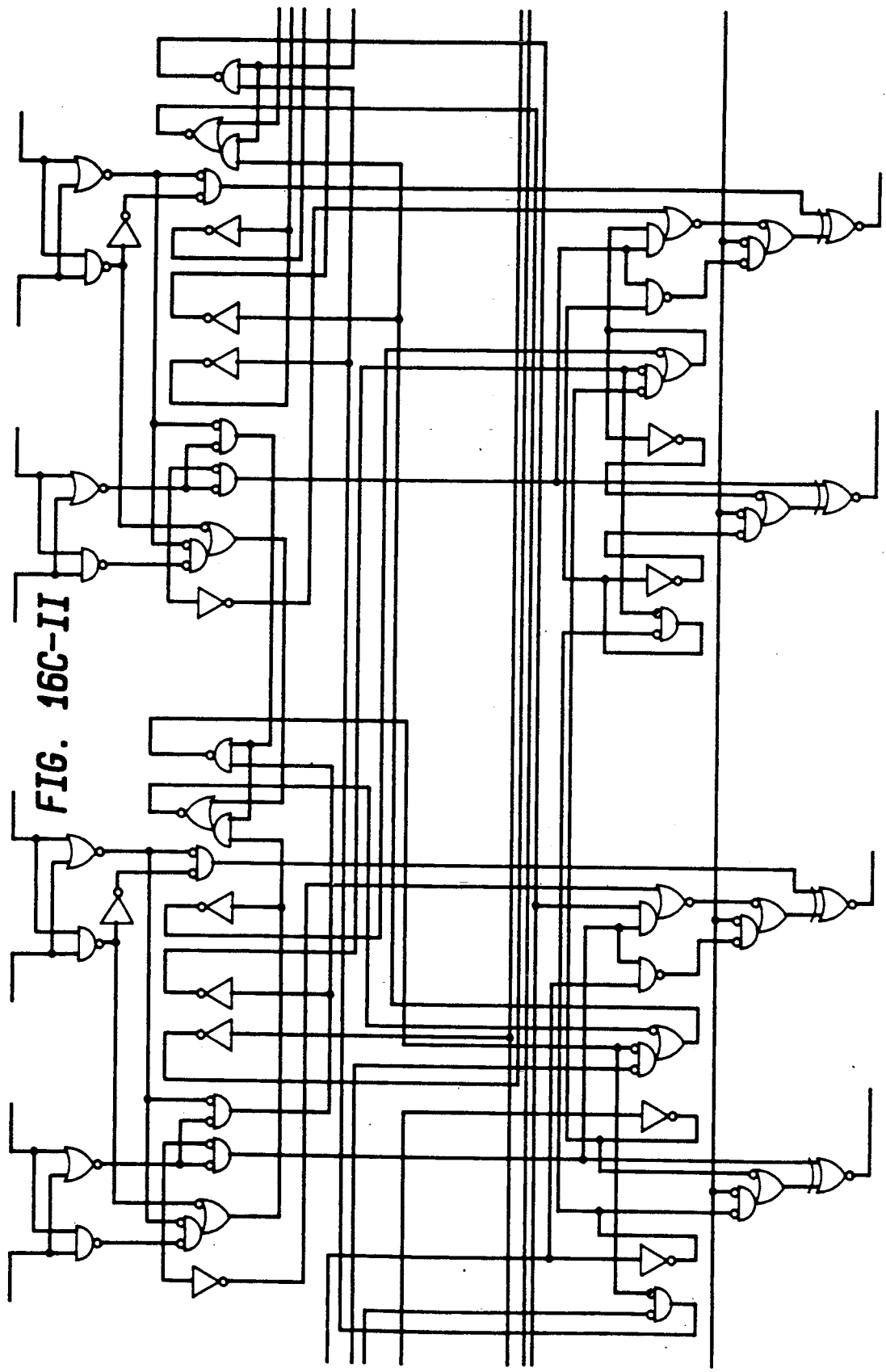
FIG. 16C-II

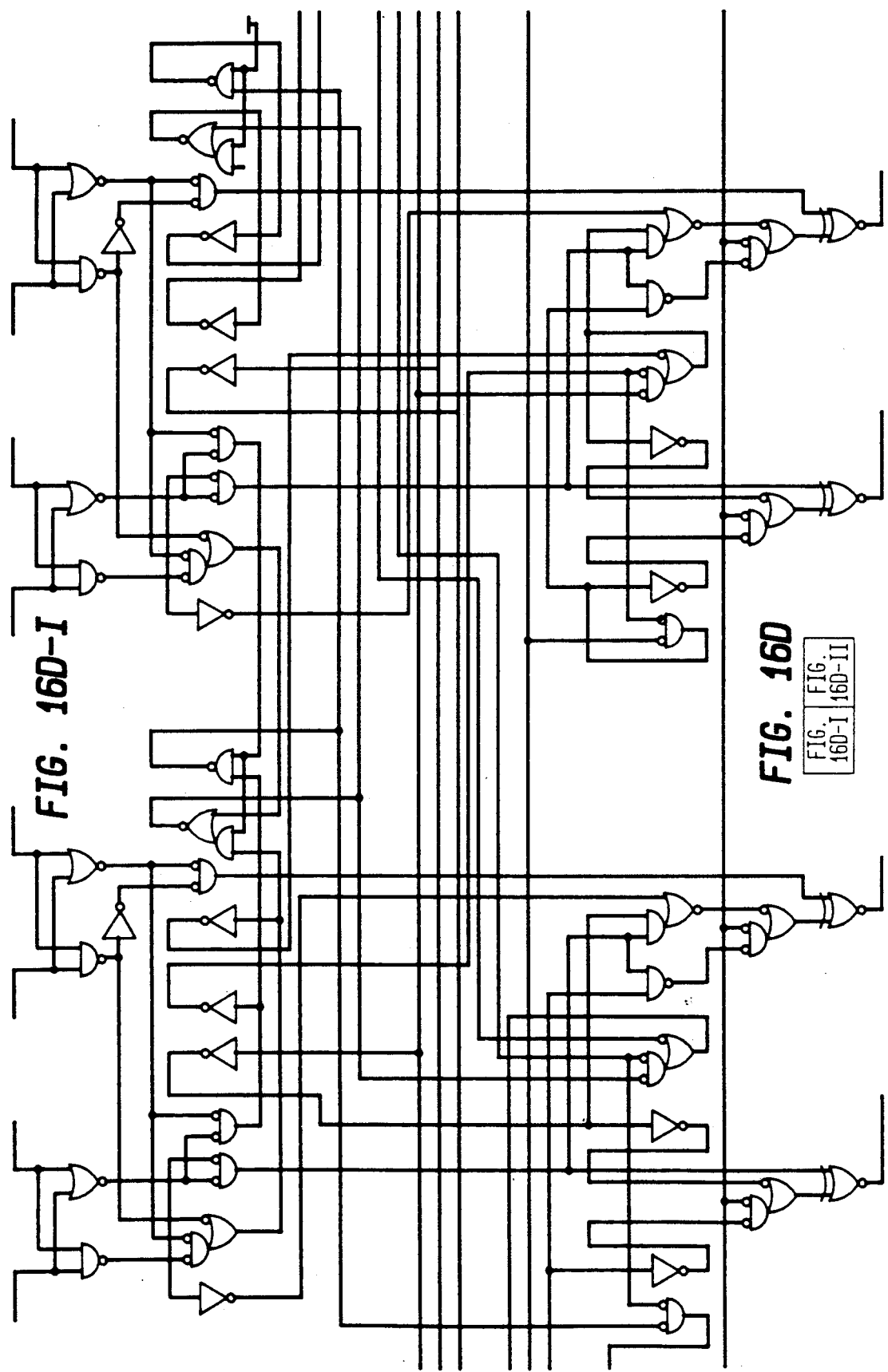

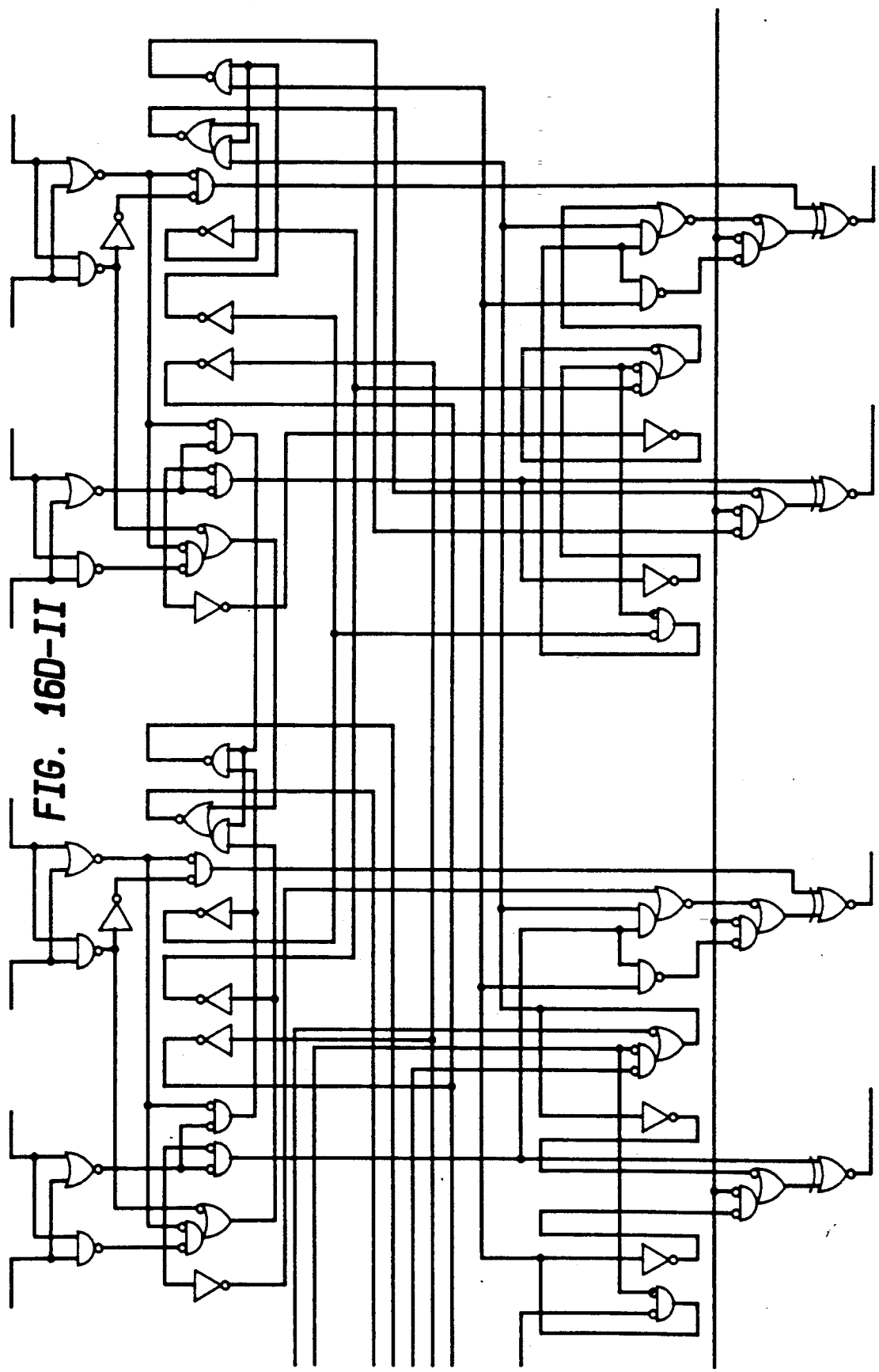
FIG. 16D-II

CELL BASED ADDER WITH TREE STRUCTURED CARRY, INVERTING LOGIC AND BALANCED LOADING

FIELD OF THE INVENTION

The present invention relates generally to an adder for use in microprocessors. More specifically, the invention relates to a cell based implementation of a fast adder including tree structured carry, inverting logic and balanced loading. A similar tree structured carry has been disclosed in co-pending application, "Cell Based ALU with Tree Structured Carry, Inverting Logic and Balanced Loading" Ser. No. 106,071, filed on Oct. 7, 1987, now U.S. Pat. No. 4,882,698, issued Nov. 21, 1989.

BACKGROUND AND SUMMARY OF THE INVENTION

In the design of microprocessors, it has generally been desirable to provide fast and low powered operation. One manner of providing a fast adder is providing a tree structure for carry generation which results in a carry propagation delay proportional to log (N), where (N) is the number of bits in the adder. The base for the log is the number of bits being combined at each node in the tree. For example, if two bits are combined at each node in the tree and it is a 16-bit processor, then the propagation delay through the adder is proportional to $\log_2(16)$ which equals 4.

An example of a tree structure for carry generation is provided in "Digital CMOS Circuit Design", by Marco Annaratone, pages 204-209, at page 207 where FIG. 6-34 illustrates an internal cell having a tree structure for carry generation. The equation at page 207 of the above article illustrates that noninverting logic is to be utilized. Also, the tree structure illustrated provides fanout at least as high as five for a 16-bit adder.

Another known Arithmetic Logic Unit, ALU, scheme is disclosed in U.S. Pat. No. 4,559,608. This patent relates to a CMOS ALU and discloses a look ahead carry circuit using inverting logic.

The present invention provides a full function adder. A full function adder adds two input variables A and B plus a carry in and provides the sum and the carry out of the most significant bit. In the description of the invention it will be convenient to refer to various variables which are generally used in reference to adder design and functioning. These commonly used terms are defined as follows:

Arithmetic Operations

| | |
|---|---|
| $S_N$ = Sum from $N^{th}$ bit | $C_{N-1}$ = Carry into the $N^{th}$ bit |
| $C_N$ = Carry from $N^{th}$ bit | $A_N$ = A input to the $N^{th}$ bit |
| $P_N$ = Propagate term of the $N^{th}$ bit | $B_N$ = B input to the $N^{th}$ bit |
| $G_N$ = Generate term of the $N^{th}$ bit | |

The benefits of the invention may be readily illustrated with respect to an operation where:

$$S_N = A_N \text{ XOR } B_N \text{ XOR } C_{N-1}$$

$$C_N = G_N \text{ OR } P_N C_{N-1}$$

$$G_N = A_N B_N$$

To better understand the operation of the adder of the present invention, consider that $G_N$ is a term in which a carry is generated independent of carry-in. $P_N$ is a term which causes the carry-in to be propagated to the next bit position. Therefore, there are two possible implementations for $P_N$, i.e., 1) $P_{FN} = A_N \text{ OR } B_N$ (OR represents the INCLUSIVE OR function)
2) $P_{SN} = A_N \text{ XOR } B_N$ (XOR represents the EXCLUSIVE OR function)

The first implementation, $P_{FN}$, can generally cause $P_N$ to be generated faster than in the second implementation, $P_{SN}$, but the first implementation cannot be used to directly generate the sum $S_N$. The second implementation generates a $P_N$ which can be used both to generate $C_N$ and $S_N$ directly, since:

$$S_N = A_N \text{ XOR } B_N \text{ XOR } C_{N-1}$$

$$S_N = P_{SN} \text{ XOR } C_{N-1}$$

Therefore:

$$P_{FN} = A_N \text{ OR } B_N$$

$$P_{SN} = A_N \text{ XOR } B_N$$

$$G_N = A_N B_N$$

$$C_N = G_N \text{ OR } P_N C_{N-1}$$

$$S_N = P_{SN} \text{ XOR } C_{N-1}$$

Where $P_N$ is used to represent that either $P_{FN}$ or $P_{SN}$ can be used to logically generate the function, $P_{FN}$ will be used where speed is important in the carry propagation logic and $P_{SN}$ will be used to generate the sum $S_N$ which generally must wait for $C_{N-1}$ to be generated.

There are three generally recognized methods of propagating the carry:
1) Ripple Carry
2) Look Ahead Carry
3) Tree Structured Carry In ripple carry, a carry generated in the least significant bit and is serially propagated to each higher order bit. The total delay (tp) is generally:

$$tp = K_1 + nK_2$$

Where $K_1$ and $K_2$ are constants and n is the number of bits. Thus, the propagation of the carry through the carry propagation circuitry is proportional to the number of bits (n).

In look ahead carry, a carry generated from an m-bit group of bits is then serially propagated to each higher bit group by skipping over bits in groups of m bits. The total propagation delay is generally of the form:

$$tp = K_1 + n/m K_2$$

Where m is the number of bits per group. Here too, the propagation through the carry propagation circuitry is proportional to the number of bits (n).

The tree structure computes carrys by combining carrys in groups of m bits, groups are combined from the least to most significant bit until a particular bit position's carry is computed. All carrys are computed in parallel. The general form of the propagation delay is:

$$t_p = K_1 + K_2 \log_m(n)$$

This implementation generally requires the most hardware but give the fastest results because the delay grows as $\log_m(n)$ rather than being proportional to n as in ripple carry and look ahead carry. It should be noted that the constants for ripple carry, look ahead carry and the structured carry are not necessarily the same. A tree structure adder generates all propagate and generate terms in parallel then combines the propagate and generate terms of bit position N with lower order bits to form the complete carry term $C_N$.

An analysis of the logic functions needed to derive $C_N$ is shown below:

$$C_N = G_N \text{ OR } P_N(C_{N-1})$$

However, $C_{N-1}$ must also be considered, so:

$$C_N = G_N \text{ OR } P_N (G_{N-1} \text{ OR } P_{N-1}(G_{N-2} \text{ OR } P_{N-2}(G_{N-3} \ldots (G_O \text{ OR } P_O C_{IN})) \ldots )$$

Expanding again reveals:
$$C_N = G_N \text{ OR } P_N G_{N-1} \text{ OR } P_N P_{N-1} G_{N-2} \text{ OR } P_N P_{N-1} P_{N-2} G_{N-3} \text{ OR } \ldots P_N \ldots P_1 G_O \text{ or } P_N \ldots P_O C_{IN}$$

Two bit positions' propagate and generate terms can be combined as follows:

$$P_N' = P_N P_{N-1}$$

$$G_N' = G_N \text{ OR } P_N G_{N-1}$$

The $G_N'$ terms are important in the carry portion of the adder and are generated in complex gates. Since the complex gates which are used in the implementation of the carry circuitry as well as the P and G generate circuit and output circuit involve the execution of multiple logical combinations in a single gate, shorthand notations for these gates are conveniently used to identify their functions. For instance, the gates shown in FIGS. 1C (AND/NOR) and 1D (OR/NAND) are used in the carry circuitry as the logical elements which make up the tree structure. Since it will be necessary to identify the various inputs to these complex gates, reference will be made to the AND inputs xxx, yyy (e.g. inputs 131, 132 in FIG. 1C, and the NOR input zzz of the AND/NOR gates and to the OR inputs xxx (e.g. inputs 131, 132 in FIG. 1C), yyy and the NAND input zzz of the OR/NAND gates, (e.g. input 143 in FIG. 1D) where xxx, yyy and zzz are the connection identifier numbers. Alternatively, the signals provided to the inputs will merely be referred to as the input P and G terms or P and G signals. FIGS. 1A-1D illustrate various logic symbols for gates and FIGS. 2A-2F illustrate various implementations of these gates.

According to the present invention, an adder can be designed from a repeatable cell which contains the necessary components for a given number of bits of the adder. Thus, if the cell contains the necessary circuitry for two bits of the adder, a 32-bit adder can be built by providing 16 repeats of the cell and providing the appropriate interconnections.

In order to simplify the cell yet insure that all necessary components are included, it is necessary to provide not only the logic gates needed for the specific tasks of the manipulation of a single bit (or two bits in a two bit arrangement) but also to provide the circuitry needed to interconnect adjacent cells.

It is an object of the present invention to provide an adder with reduced delay.

It is another object of the invention to provide a cell based adder design which includes minimum excess circuitry.

It is still another object of the invention to provide a cell design for an adder which contains all the circuitry necessary for fabrication of an adder without additional circuitry.

It is yet another object of the invention to provide a cell layout which provides a minimum number of levels of devices in the physical structure of the adder formed by use of the cell.

It is a still further object of the invention to provide a cell design which is compatible with an adder design technique having minimum propagation delay as a feature of the adder.

Another object of the invention is the provision of a cell based adder having a tree-based carry portion with inverting logic and fanout limited to a specific design factor for optimizing throughput.

These and other objects of the invention are attained by providing a cell structure having a propagate and generate portion, a carry portion and an output portion.

The propagate and generate portion of the invention provides P and G terms to the carry and output portions and the carry portion provides a carry term to the output portion. In one implementation, the carry and output portions are combined while in a more generic approach, the carry portion is separate from the output portion.

The carry portion of the cell includes a number of gates which have their inputs and outputs individually accessible during the design stages in order that these inputs and outputs may be selected to perform needed functions in the adder or may be left unused in the adder, depending upon the location of the cell in the adder design. The provision of the individually accessible gates in the cell design provides a smaller cell design than could be previously provided by adder building blocks which did not contain the individually accessible gates.

One aspect of the invention involves the provision of a carry portion which has a plurality of inverters which are totally individually accessible, as well as the provision of at least one totally individually accessible complex logic gate. A cell having these individually accessible components can be utilized in a flexible configuration such that the identical cell can be used to implement the circuitry for the bits at any location in an adder.

The use of a complex AND/NOR gate and a complex OR/NAND gate in the carry portion of the cell in combination with a plurality of inverters and at least one NOR and one NAND gate provides a cell having the necessary circuitry for a 1-bit cell which can be repeated for each bit of an adder of virtually unlimited bit length. In this version of the cell, it may be desirable to leave each input and each output of the components unconnected in order that the designer can provide the proper interconnection of the cell's components for the particular location of the cell in the adder. It is to be noted that the interconnection of the components will vary as the cell is used at different locations in the adder.

The present invention is suitable for use with either inverting or noninverting logic but is ideally suited for use with inverting logic such as is involved in the design of CMOS microprocessors. Thus, another feature of the invention is its provision of the means for designing an adder where each level of logic is inverted with respect to the preceding level, even for those signals which have not been inverted by a logical operation. This is the reason for the provision of the inverters in the carry portion of the circuitry. Another aspect of the invention is the provision of the means for keeping the maximum fanout from any gate to a manageable limit. The inverters which are used for obtaining proper logic inversions are conveniently used for a separate and unrelated purpose of driving multiple gates in cases where fanout from the preceding gate would otherwise be potentially excessive. This provides a substantial speed advantage over adder designs where excessive fanout is present. According to the present invention, adders of any arbitrary bit length may be fabricated without exceeding a fanout of three in the carry circuitry.

It is intended that the present invention will be implemented in many alternative manners all of which will be based on the general principle that a simple cell containing the necessary components for fabricating a multicell adder can be designed with certain dedicated interconnections of the components in the cell and with various components of the cell left unconnected until the adder design is assembled, at which time the cell's individually accessible inputs and outputs can be interconnected, as necessary, for the optimization of the adder design. For purposes of this description, individually accessible means that there is an input or output to a gate or node which is not connected to any other component in the cell design until a multicell adder is designed. The provision of the cell with the necessary building blocks and the flexibility to use the building blocks in a wide variety of manners without the constraints imposed by pre-connecting the individually accessible components results in a substantial savings of time and effort in adder design and fabrication. Referring to FIG. 8, it can be seen that inverter gate $G_{10}$ has its input 814, as well as its output 813, individually accessible. This is an isolated individually accessible gate which will provide great flexibility in the design of adders having any multiple of cell repeats. For purposes of this description, a gate such as this which has none of its inputs or outputs preconnected is referred to as totally individually accessible. Signals are equivalently referred to as $\overline{X}$ or XBAR in this description.

Other objects, advantages and novel features of the invention are described herein with respect to the various specific implementations of the invention.

BRIEF DESCRIPTION OF THE DRAWINGS

FIGS. 16A through 16D illustrate a 32-bit adder circuit designed according to the invention.

DETAILED DESCRIPTION OF THE DRAWINGS

Two bit positions' propagate and generate terms can be combined as follows:

$$P_N' = P_N P_{N-1}$$

$$G_N' = G_N \text{ OR } P_N G_{N-1}$$

Figure 1A:
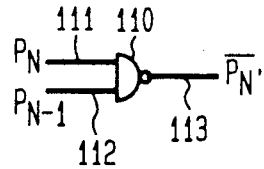
FIGS. 1A-1D illustrate logic symbols for combining generate and propagate terms.
Figure 1B:
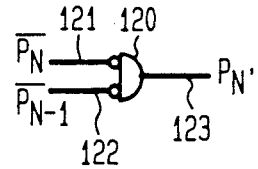

Referring to the figures, FIGS. 1A through 1D illustrate inverting logic schematics for providing the generated and propagated carry bits $P_N'$ and $G_N'$. FIG. 1A illustrates that $P_N$ and $P_{N-1}$ are combined in NAND gate 110 in order to yield $P_N'$BAR. In FIG. 1B, $P_N$BAR and $P_{N-1}$BAR are combined in NOR gate 120 to provide $P_N'$. Inverting logic implementations of P and G generation are particularly suited for CMOS applications.

FIG. 1A includes first and second NAND inputs 111, 112 which are provided to NAND gate 110. The output 113 is illustrated as providing output signal $P_N'$BAR. $P_N'$BAR is defined as being the logical NAND of $P_N$ and $P_{N-1}$.

FIG. 1B illustrates NOR gate 120 having NOR inputs 121, 122 and a NOR output 123. FIG. 1B illustrates input signals $P_N$BAR and $P_{N-1}$BAR which results in the defined output $P_N'$.

Figure 1C:
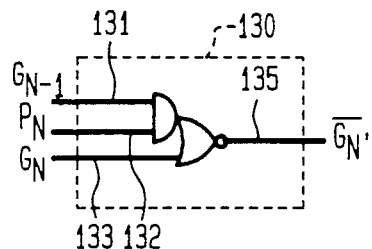

FIG. 1C shows the circuitry for generation of $G_N'$BAR at the output 135 of complex AND/NOR gate 130, where $G_N$ is provided to the NOR input 133 and $G_{N-1}$ and $P_N$ are provided to the AND inputs 131, 132 of gate 130.

Figure 1D:
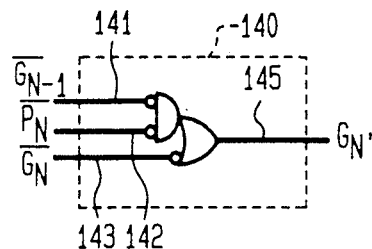

FIG. 1D shows OR inputs 141 and 142 for receiving input signals $G_{N-1}$BAR and $P_N$BAR of complex OR/NAND gate 140, where input signal $G_N$BAR is provided to the NAND input 143. The output 145 of gate 140 provides $G_N'$ as an output signal. The implementations shown in FIGS. 1C and 1D are also for inverting logic such as is encountered in CMOS circuitry. It is to be appreciated that noninverting logic could be utilized to provide $P_N'$ and $G_N'$.

Figure 2A:
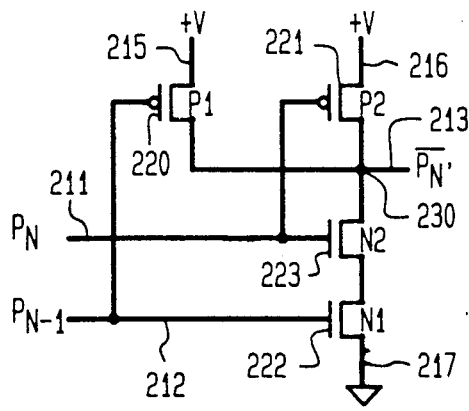
FIGS. 2A-2F illustrate circuit implementations of the logic symbols of FIGS. 1A-1D.

FIGS. 1A-1D illustrate inverting logic symbols for these combinations and suitable CMOS circuit implementations for this logic are shown in FIGS. 2A-2F. FIG. 2A illustrates the circuitry which will expeditiously implement the logic of logic schematic 1A. Inputs 211 and 212 receive input signals $P_N$ and $P_{N-1}$, respectively, to provide $P_N'$BAR at output 213. This is implemented by providing a first PMOS and NMOS transistor pair comprising $P_1$ and $N_1$, 220 and 222 each having gates to which input signal $P_{N-1}$ is provided. Transistors $P_2$ and $N_2$, 221, 223 have gates to which input signal $P_N$ is provided. Output 213 is connected to the parallel connection of $P_1$ and $P_2$ at node 230 where series connected $N_1$ and $N_2$ are connected. Thus, $P_1$ and $P_2$ are connected in parallel between the positive voltage supply 215, 216 and node 230. N channel devices $N_1$ and $N_2$ are connected in series between node 230 and ground 217.

Figure 2B:
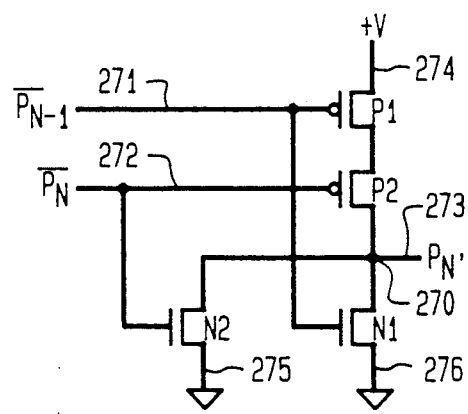

FIG. 2B illustrates a circuit implementation for the logic schematic of FIG. 1B. Inputs 271, 272, respectively, receive input signals $P_{N-1}$BAR and $P_N$BAR in order to provide output signal $P_N'$ at output 273. This logic function is implemented by providing PMOS transistors $P_1$ and $P_2$ in series between voltage supply 274 and node 270. NMOS transistors $N_1$ and $N_2$ are connected in parallel between node 270 and ground 275, 276. Output 273 is provided from node 270.

Figure 2C:
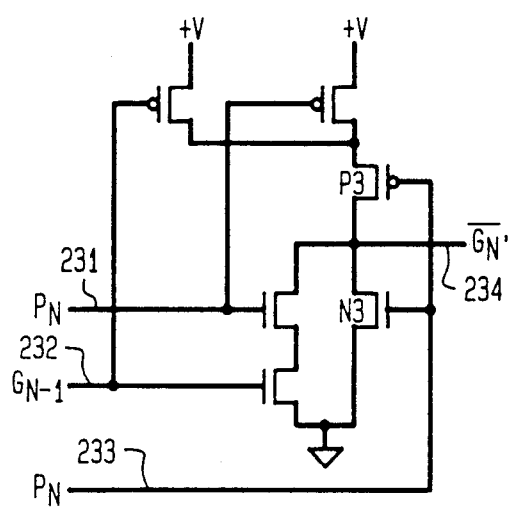
Figure 2D:
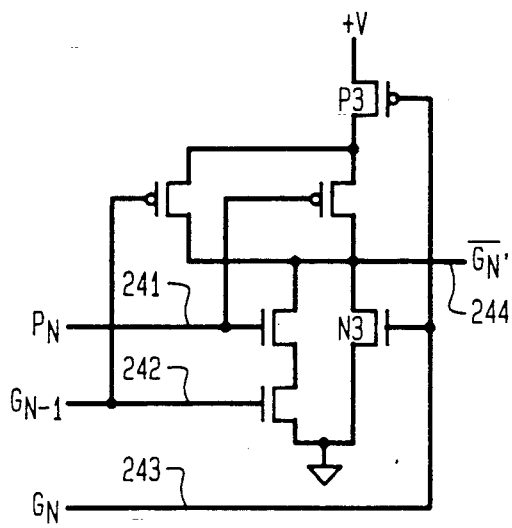

FIGS. 2C and 2D illustrate alternative circuit implementations capable of implementing the logic of the logic symbol of FIG. 1C. In FIG. 2C inputs 231 and 232, respectively, receive input signals $P_N$ and $G_{N-1}$, while input 233 which is coupled to the gates of NMOS transistor $N_3$ and PMOS transistor $P_3$, receives input signal $G_N$. Output 234 provides output signal $G_N'$BAR. FIG. 2D illustrates an alternative implementation where input 41 receives input signal $P_N$, input 242 receives input signal $G_{N-1}$, and input 243 which is coupled to the gates of NMOS transistor $N_3$ and PMOS transistor $P_3$, receives input signal $G_N$. Output signal $G_N'$BAR is provided at output 244.

Figure 2E:
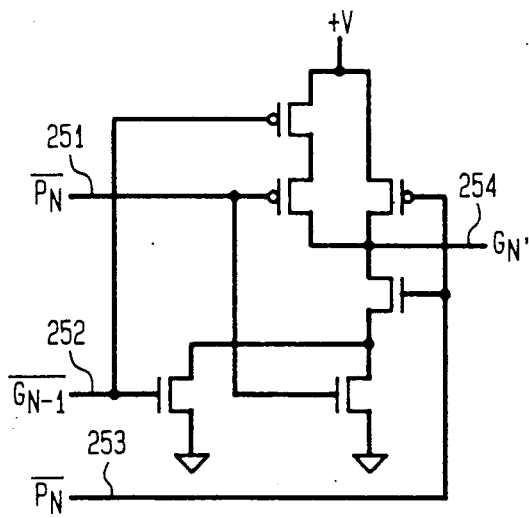
Figure 2F:
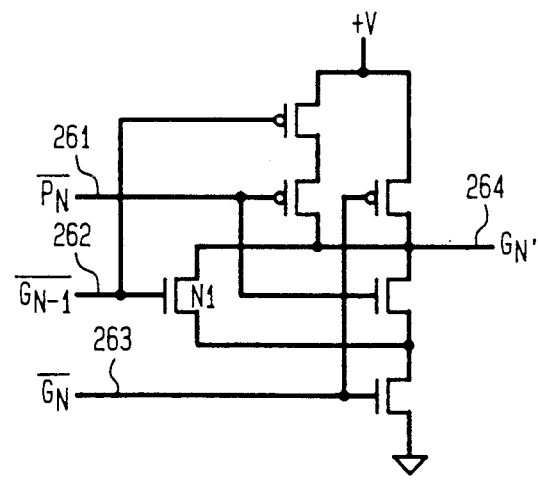

Finally, FIGS. 2E and 2F illustrate alternative circuitry capable of implementing the logic schematic of FIG. 1D. In FIG. 2E input signal $P_N$BAR is provided to input 251, while input signals $G_{N-1}$BAR and $G_N$BAR are provided, respectively, to inputs 252 and 253. At output 254, output signal $G_N'$ is provided. FIG. 2F shows an alternative implementation for providing output $G_N'$ at output 264. Input 261 receives input signal $P_N$BAR, while input 262 receives input signal $G_{N-1}$BAR. Input 263 receives input signal $G_N$BAR.

Figure 3A:
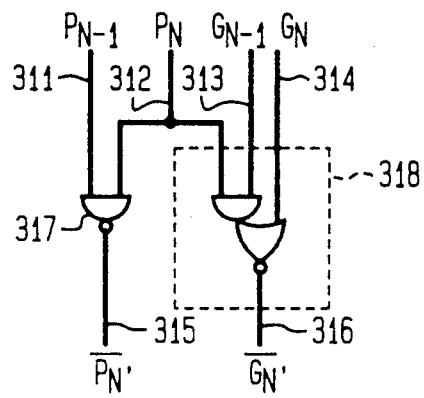
FIGS. 3A and 3B illustrate logic schematics for combining generate and propagate terms in a carry-tree gate.
Figure 3B:
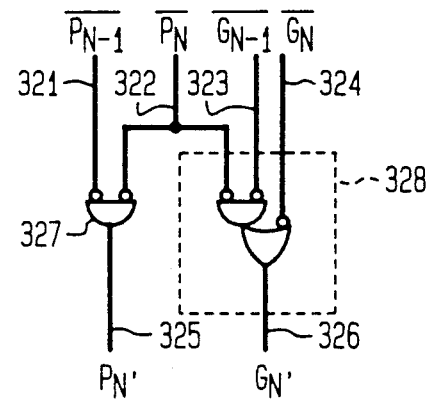
Figure 3C:
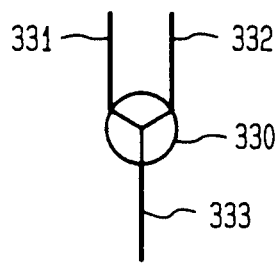
FIG. 3C is a carry-tree gate symbol.

FIGS. 3A and 3B illustrate logic schematics for providing $P_N'$BAR, $G_N'$BAR and $P_N'$, $G_N'$, respectively. $P_N'$BAR and $G_N'$BAR are provided by the integrated circuit arrangement of FIG. 3A, where NAND gate 317 receives at its inputs 311, 312 input signals $P_{N-1}$ and $P_N$, respectively and provides $P_N'$BAR at its output 315. Complex AND/NOR gate 318 receives at its AND inputs 312, 313 input signals $P_N$ and $G_{N-1}$, respectively, while input signal $G_N$ is provided to NOR input 314. Output 316 of AND/NOR gate 318 provides output signal $G_N'$BAR. FIG. 3B shows the inverse function for providing $P_N'$ and $G_N'$ rather than $P_N'$BAR and $G_N'$BAR, as shown in FIG. 3A. In FIG. 3B, NOR inputs 321 and 322 receive as input signals $P_{N-1}$BAR and $P_N$BAR, respectively, so that NOR gate 327 will provide $P_N'$ at output 325. OR/NAND gate 328 receives input signals $P_N$BAR and $G_{N-1}$BAR at its OR inputs 322, 323, respectively, and receives input signal $G_N$BAR at its NAND input 324 to provide output signal $G_N'$ at output 326. For simplicity in the drawings, the circuitry which implements these logic functions will be described by the shorthand notation "carry-tree gate" which is illustrated at 330 in FIG. 3C. The illustration shown in FIG. 3C is used to represent the appropriate one of the circuit functions provided by the logic schematics shown in FIGS. 3A and 3B, respectively. The inputs 331 and 332 in FIG. 3C represent terminals 311, 312, 313 and 314 illustrated in FIG. 3A or, alternatively, terminals 321, 322, 323 and 324 represented in FIG. 3B. In either event, inputs 331 and 332 in FIG. 3C receive P and G terms for bits N−1 and N. Output 333 in FIG. 3C represent terminals 315 and 316 of FIG. 3A or outputs 325 and 326 of FIG. 3B. In either event, output 333 in FIG. 3C provides $P_N'$ and $G_N'$ terms.

Figure 3D:
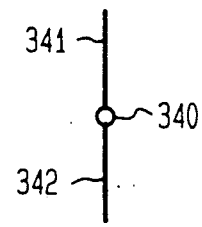
FIG. 3D is a symbol representing the circuitry which inverts a group of signals.

FIG. 3D is a shortened notation for inverters which are used in the illustrations in the present application for convenience. Input 341 provides a pair of given signals to inverter 340 which provides the inverse of the input signals at the output terminal 342. Additionally, FIG. 3D is a shortened notation for an inverter pair.

Figure 4:
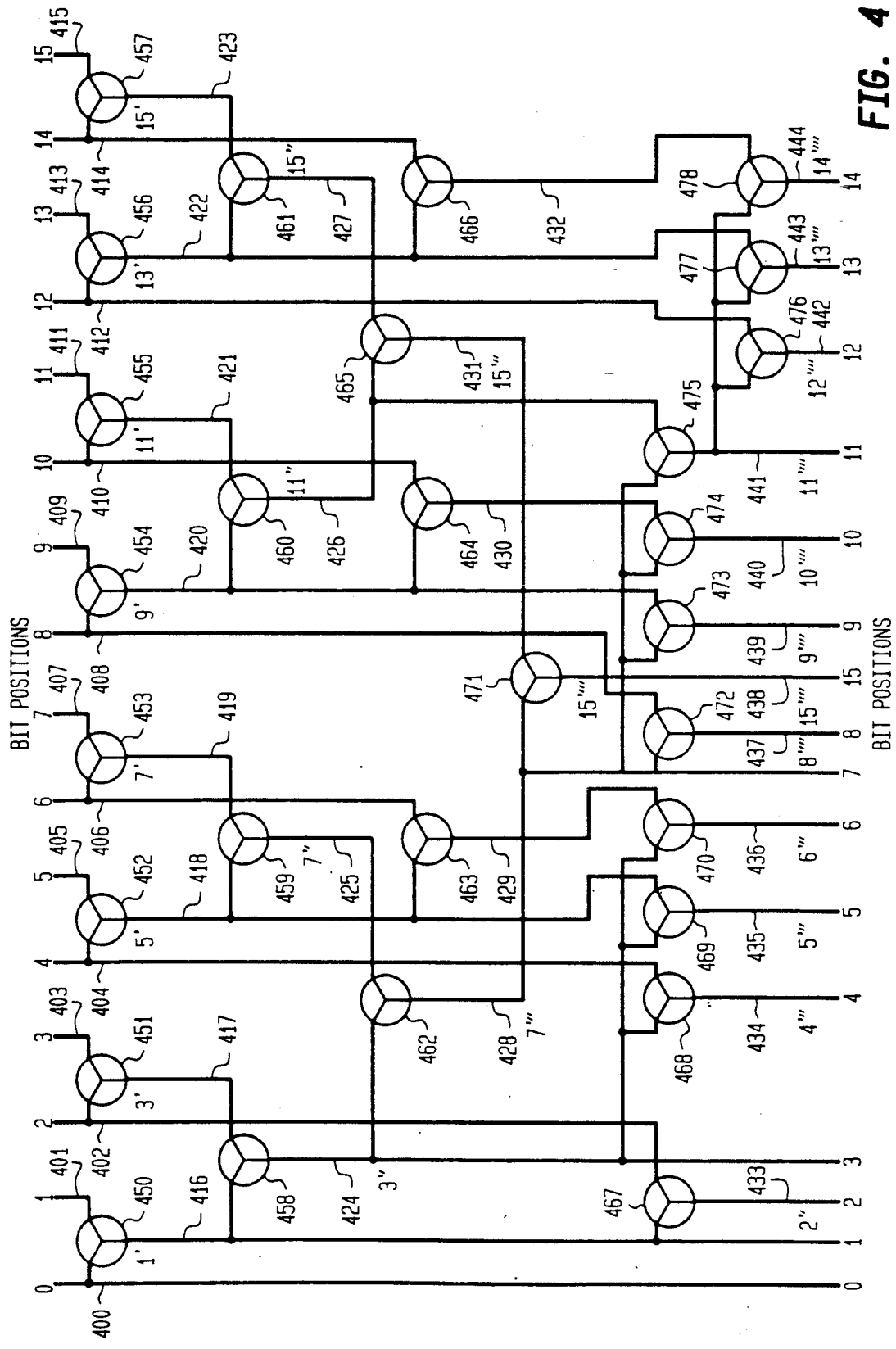
FIG. 4 illustrates a carry-tree structure for a 16-bit adder.

FIG. 4 illustrates a logic implementation of the carry propagate portion of an adder. The inputs 400, 401 through 415 are each adapted to receive the respective P and G terms provided from the P and G generate portion of the adder. Thus, input 400 will receive a P and a G term. Similarly, input 401 will receive a P and a G term from the next higher order bit. Thus, assuming that $P_0$ and $G_0$ are provided to input 400, then $P_1$ and $G_1$ will be provided to input 401. Then, $P_1'$ BAR and $G_1'$BAR will be provided on output line 416. In similar fashion, inputs 402 and 403 will receive P and G terms at inputs 402 and 403, providing $P_3'$BAR and $B_3'$BAR terms on line 417. Carry-tree gate 458 will receive at its input lines 416 and 417 the $P_1'$BAR, $P_3'$BAR, $G_1'$BAR and $B_3'$BAR terms to provide $P_3''$ and $G_3''$ prime terms at output line 424. Since the signals provided on each of lines 416 and 417 have each traversed a single carry-tree gate, 450, 451, respectively, the P' and G' terms are both BARRED terms. Thus, the sense of the logic is correct as it enters carry-tree gate 458. Similarly, the sense of the input signals provided to carry-tree gate 459 are also of proper sense, since lines 418 and 419 carry P' and G' terms which have traversed single carry-tree gates 452 and 453, respectively. Thus, the inputs to carry-tree gates 458 and 459 are both odd for each carry-tree gate. Carry-tree gate 462 receives inputs from lines 424 and 425 which have each traversed an even (2) number of prior carry-tree gates. Thus, the structural implementation of carry-tree gate 462 may be identical to that of carry-tree gates 450, 451, 452, ... 457. These may be, for instance, an implementation as shown in FIG. 3A. Carry-tree gates 458, 459, 460 and 461 will be the inverse carry-tree gates illustrated in FIG. 3B. The next level of logic 462 and 465 is again of the form of implementation illustrated in FIG. 3A. However, for purposes of illustration, carry-tree gate 469 is seen to include input line 418 and input line 424. The P and G terms present on line 424 have traversed two carry-tree gates, i.e. 450, 458, while the P and G terms on line 418 have traversed only carry-tree gate 452. Thus, gate 469 will be receiving P and G terms of opposite sense. This would result in the need to provide a third type of carry-tree gate capable of receiving for instance $P_{N-1}$ and $G_{N-1}$ terms and combining them with $P_N$BAR and $G_N$BAR terms.

Lines 426 and 427 from respective gates 460 and 461 are coupled to inputs of gate 465. Line 426 are also coupled into one input of gate 475. Line 429 from gate 463 is coupled to one input of gate 470. Line 430 from gate 464 is coupled to one input of gate 474. Gate 463 has one input coupled to line 418 and another input coupled to line 406. Its output is coupled over line 429 to one input of gate 470. Gate 464 has one input coupled to line 420 and another input coupled to line 410. Its output is coupled over line 430 to one input of gate 474. Gate 466 has one input coupled to line 422 and another input coupled to line 414. Its output is coupled over line 432 to one input of gate 478. Gate 472 has one input coupled to line 428 and another input coupled to line 408. Its output is coupled over line 437 to bit position No. 8. Gate 473 has one input coupled to line 428 an another input coupled to line 420. Its output is coupled over line 439 to the No. 9 bit position. Gate 476 has one input coupled to line 441 and another input coupled to line 412. Its output is coupled over line 442 to the No. 12 bit position. Gate 477 has one input coupled to line 441 and another input coupled to line 422. Its output is coupled over line 443 to bit position No. 13. Gate 478 has one input coupled to line 441 and another input coupled to line 432. Its output is coupled over line 444 to bit position No. 14. Gate 454 has respective inputs coupled to lines 408 and 409 and an output coupled to line 420. Gate 455 has inputs coupled to lines 410 and 411 and an output coupled to line 421. Gate 456 has inputs coupled to lines 412 and 413 and an output coupled to line 422. Gate 457 has inputs coupled to lines 414 and 415 and an output coupled to line 423.

In optimizing circuit design for inverting logic requires that all the inputs to the carry-tree gates be of the same sense. Thus, it can be seen that FIG. 4 requires the use of a different form of logic such as a noninverting logic form of carry-tree gates and thus is not optimized for providing a carry-tree structure using inverting logic. As the tree structure in FIG. 4 is further analyzed, it can be seen, for instance, that carry-tree gate 471 receives its inputs from lines 428 and 431 in the proper sense and provides its outputs at output 438. Carry-tree gate 468 receives its inputs in the proper sense because the input from 404 has no inverting carry-tree gates in its path, while input from line 424 is inverted twice, due to traversing two carry-tree gates in its path. Thus, the output provided at output 434 is of the proper sense. However, outputs 433, 435, 437, 440, 441, 442, 443 and 444 all have outputs which have traversed at least one carry-tree gate where the sense was improper, that is one odd number of carry-tree gates traversed and one even number of carry-tree gates traversed.

Figure 7:
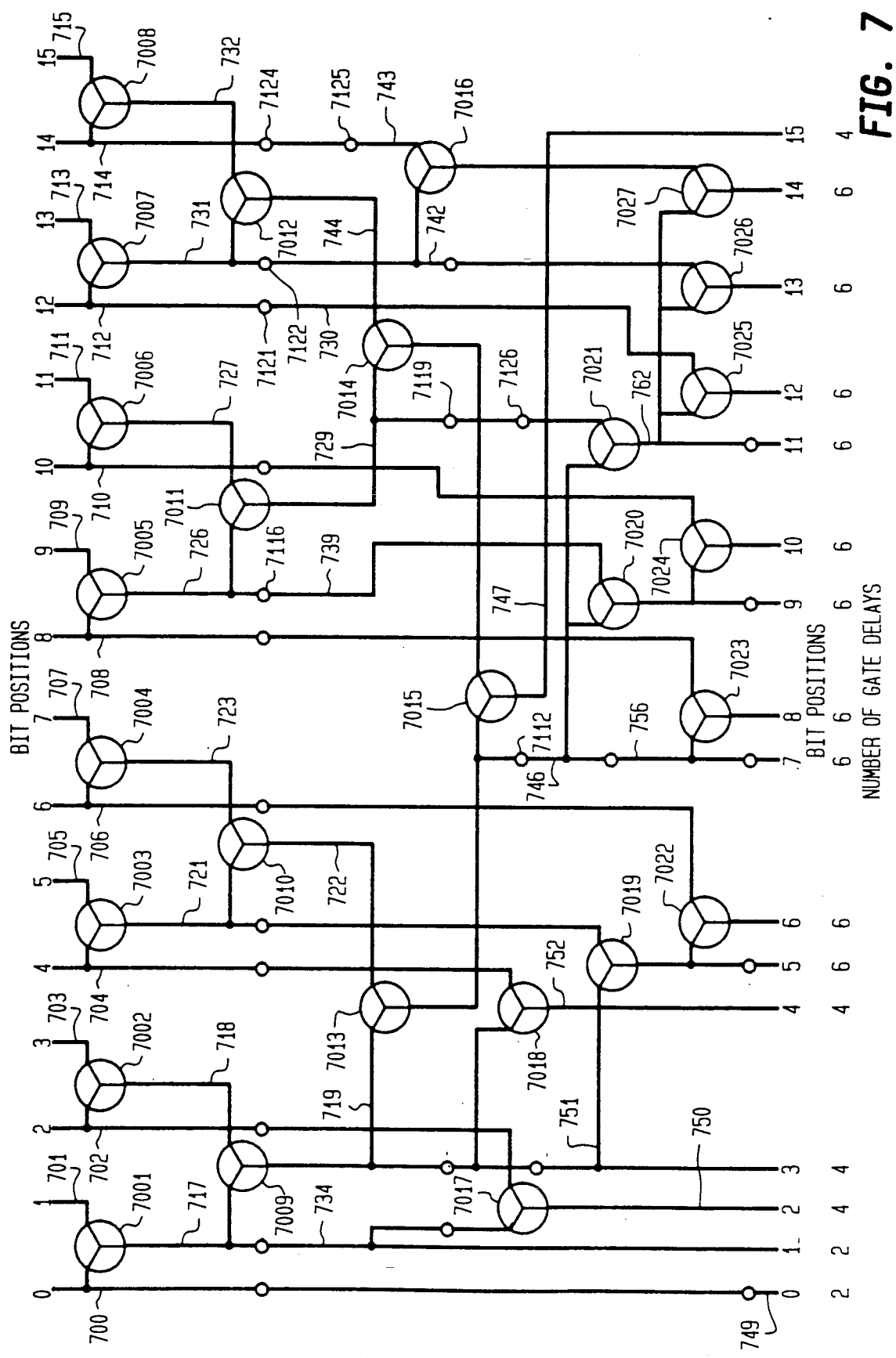
FIG. 7 illustrates a carry-tree structure for a 16-bit adder, where every node receives all of its inputs with either all odd or all even number of levels of gates.

It has been found that the provision of inverters can provide the additional levels of logic needed to insure that each of the inputs to a logic element have traversed either an even or an odd number of preceding levels. FIG. 7 illustrates the use of inverters to solve the problem of improper sense of the signals in a tree structured carry using inverting logic arrangement.

Another important factor in adder design relates to the loading of the nodes in the adder carry array. Referring to FIG. 4, it can be seen that the fanout of the carry-tree gates vary from a low of a fanout of one for, inter alia, lead 417, to a high of six, five carry-tree gates plus the output load, for lead 428 which is the output from carry-tree gate 462. Additionally, the provision of inverters will allow for the minimization of loading on the most heavily loaded nodes, as explained with respect to FIG. 7.

Figure 5:
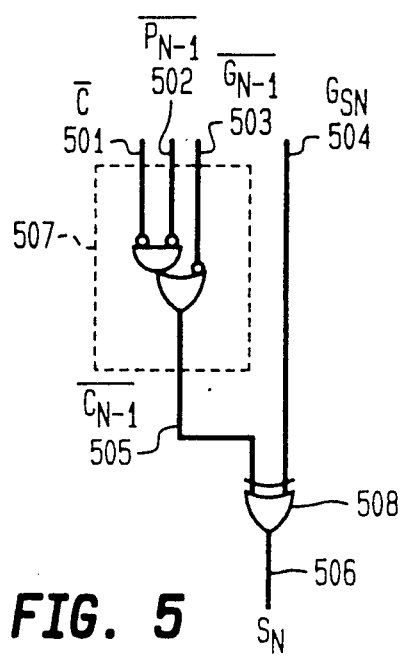
FIG. 5 illustrates a logic schematic for providing sum bits.

FIG. 5 illustrates an inverting logic schematic for implementing the logic functions which are useful in providing output signals from the adder. OR/NAND gate 507 has OR inputs 501 and 502 for receiving CBAR and $P_{N-1}$'BAR input signals, and NAND input 503 for receiving the $G_{N-1}$'BAR input signal. The output 505 from gate 507 provides $C_{N-1}$ as an output signal. The output signal $S_N$ is obtained at the output 506 of EXCLUSIVE OR gate 508 when the inputs 504, 505 have $PS_N$ and $C_{N-1}$ signals, respectively. The following equations are implemented by the circuit of FIG. 5:

$$C_{N-1} = G_{N-1}'BAR\ NAND\ (P_{N-1}'BAR\ OR\ CBAR)$$

$$S_N = PS_N\ XOR\ C_{N-1}$$

Figure 6:
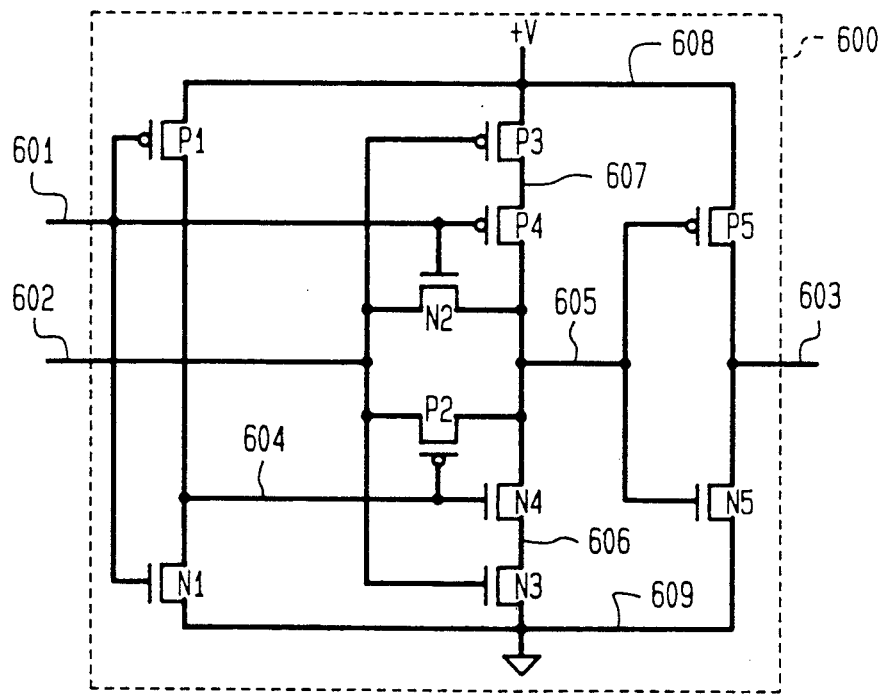
FIG. 6 illustrates a circuit implementation of an EXCLUSIVE OR function.

It is noted that $PS_N$ is available prior to the availability of $C_{N-1}$ due to the propagation delays involved in the generation of $C_{N-1}$. Thus, the circuit implementation of FIG. 6 may be employed to perform the EXCLUSIVE OR function and also to provide a buffered output. This implementation minimizes the delay from $C_{N-1}$ to $S_N$. This is the time required for the signals to get from input 602 to output 603 of FIG. 6. Input 601 to EXCLUSIVE OR circuit 600 provides an input signal to the gates of P channel devices $P_1$ and $P_4$ and to the gates of N channel devices $N_1$ and $N_2$. The input signal provided to input 602 is provided to the gates of P channel device $P_3$ and N channel device $N_3$. Additionally, the signal provided to input 602 is provided to the sources of devices $P_2$ and $N_2$. It is noted that, while sources used here to denote one of the source or drain regions of devices $N_2$ and $P_2$, it would be equally feasible to have the input 602 connected to the drains of these respective devices or the source of one and drain of the other of these devices. The significant feature is that it is connected to one end of the device, while the other end of each of devices $N_2$ and $P_2$ is connected to node 605. It is additionally noted that P channel devices $P_3$ and $P_4$ are series connected via link 607, between the voltage supply 608 and node 605, while N channel devices $N_3$ and $N_4$ are connected in series via link 606, between node 605 and ground 609. It is also noted that inverter devices $P_1$ and $N_1$ are series connected between the voltage supply and ground. The output of inverter $P_1$ and $N_1$ drains, 604, drive the gates of transistors $P_2$ and $N_4$. Two additional devices, output inverter $P_5$ and $N_5$, are provided series connected between the voltage supply and ground and having their gates connected to node 605 and their drains connect to output 603. Output 603 of EXCLUSIVE OR gate 600 is connected at the series connection of devices $P_5$ and $N_5$.

FIG. 7 illustrates an embodiment of the carry logic arrangement of FIG. 4 which has been modified to provide inverters as needed to insure that the inputs to each node of the array have traversed either both an odd or both an even number of logic levels. An inverter will be considered to be a level of logic for purposes of this description, since it will invert the sense of the signal just as will occur at each carry-tree gate. As can be seen in FIG. 7, the maximum number of logic levels which is encountered is six. The use of inverters provides dual functions in the arrangement of FIG. 7, including the minimization of loading on the nodes of the network and the provision of an appropriate number of inversions to permit use of inverting logic such as is encountered in CMOS.

Referring to FIG. 7 which includes 16 inputs, 700 through 715, each of which inputs carries P and G terms from respective bit positions, and carry-tree gates 7001 through 7027. Carry-tree gates 7001 through 7008 receive the P and G terms from inputs 700 through 715 and provide P' and G' terms on lines 717, 718, 721, 723, 726, 727, 731 and 732. Each of these P' and G' terms has traversed a single carry-tree gate and hence has its polarity inverted relative to the logic levels provided at inputs 700 through 715. Carry-tree gate 7009 through 7012 receive the P' and G' terms and provide P'' and G'' terms on lines 719, 722, 729 and 744. P'' and G'' signals provided to carry-tree gates 7013 and 7014 are combined to form P''' and G''' terms which terms themselves are combined in carry-tree gate 7015 to form P'''' and G'''' terms on line 747 which provides its output at the most significant bit output location. Carry-tree gate 7016 receives the input signal from input 714 which has been inverted twice in gates 7124 and 7125, respectively, at its input 743 and receives the P' and G' terms derived in gate 7007 having been inverted by inverter 7122 at its second input 742.

It can be seen that each input path has resulted in two signal inversions, the first being at carry-tree gate 7007 and inverter 7122, respectively, and the second being at inverters 7124 and 7125, respectively. Thus, the two inputs have both been inverted an even number of times and have traversed an even number of logic levels prior to reaching carry-tree gate 7016. Carry-tree gate 7020 receives its input signals respectively from lines 746 and 739. Input line 739 has traversed two inversions, the first at carry-tree gate 7005 and the second at inverter 7116, while the input signal on line 746 has been inverted four times, the first being at the respective carry-tree gates 7001 through 7004, the second being at carry-tree gates 7009 and 7010, the third being carry-tree gate 7013 and the fourth being at inverter 7112. Carry-tree gate 7025 illustrates the carry-tree gate where the inputs have both traversed an odd number of logic levels. Input line 730 has traversed the single logic level at inverter 7121, while input 762 has traversed carry-tree gate 7021, inverter 7126, inverter 7119, carry-tree gate 7011, and carry-tree gates 7005, 7006. In the other branch 746 input to carry-tree gate 7021, the signal has traversed inverter 7112, carry-tree gate 7013, carry-tree gates 7009, 7010, and carry-tree gates 7001, 7002, 7003, 7004.

In addition to providing carry-tree gates where each input either has both odd or both even number of preceding logic levels in order to preserve proper logic sense of the signals, the number of logic levels traversed through the tree structure is limited to six delays. It can be seen that outputs 749 and 734 involve two gate delays, while four gate delays are encountered at outputs 750, 751, 752 and 747. The remaining outputs each traverse six gate delays prior to reaching the output. The maximum loading on a gate has been reduced from six in FIG. 4 to four in FIG. 7.

For a 32-bit design, it is possible to use the principles of the invention to expand the arrangement of FIG. 7. It is seen that, for a 32-bit adder, $C_{15} = G_{15}''''$ OR $P_{15}''''C_{IN}$. However, $G_{15}''''BAR$ and $P_{15}''''BAR$ are available in four gate delays and it takes one gate delay to generate $C_{15}$. The $C_{15}$ signal can be used to drive multiple inverters in parallel or a single larger inverter, and these inverters can be used to drive the CBAR for bits 16 through 31. Each inverter has a fanout of 16/X where X is the number of inverters used. Thus, if four inverters are used, the fanout is four and the sum from bits 16 through 31 are ready at the same time as from bits 6 through 15, or six delays from the input to the output of the above carry logic circuitry.

Figure 8:
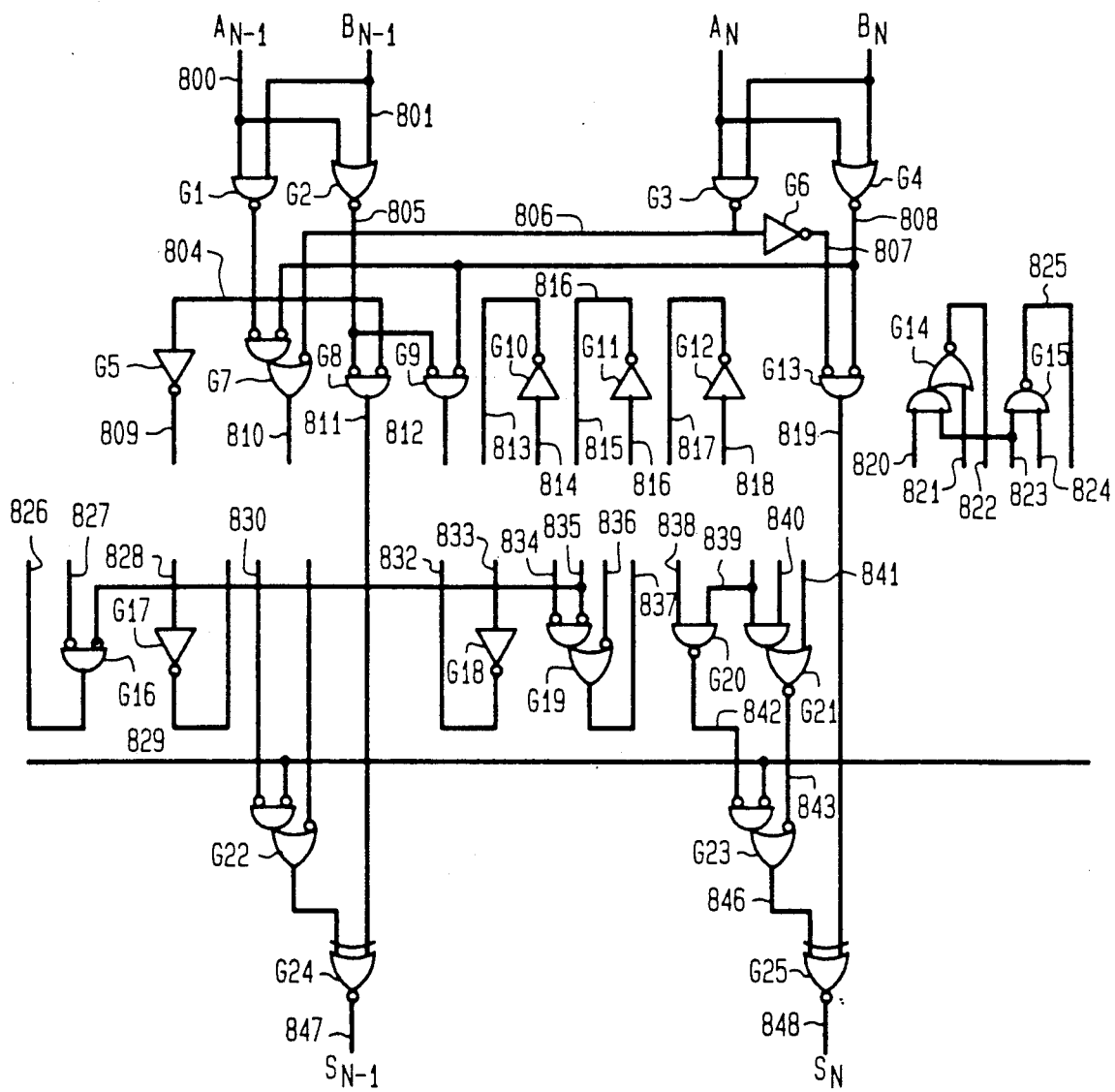
FIG. 8 illustrates circuitry for a 2-bit adder cell.

FIG. 8 illustrates a cell for the adder which includes the front end, carry propagate portion and the output portion. This cell can be repeated multiple times in the design of an adder to provide 2 bits of an N bit adder for each repeat of the cell. Thus, for a 16-bit adder, the cell would be repeated 8 times.

FIG. 8 illustrates the logic necessary to implement two bits of an adder. Input 800 is a variable $A_{N-1}$ and input 801 is the input variable $B_{N-1}$. The two inputs to NAND $G_1$ and NOR $G_2$ are $A_{N-1}$ and $B_{N-1}$. The output of NAND $G_1$ is the signal $G_{N-1}BAR$ on line 804. The output of NOR $G_2$ is the signal $P_{FN-1}BAR$ on line 805. Input variable $A_N$ is on line 802 and $B_N$ is on line 803. The two inputs to NAND $G_3$ and NOR $G_4$ are $A_N$ and $B_N$. The output of NAND $G_3$ is the signal $G_N BAR$ on line 806 and the output of NOR $G_4$ is the signal $P_{FN}BAR$ on line 808. Inverter $G_5$ inverts the signal $G_{N-1}BAR$ on 804 to produce $G_{N-1}$ on line 809. Inverter $G_6$ inverts the signal $G_N BAR$ on 806 to produce $G_N$ on line 807. OR/NAND gate $G_7$ produces $G_N'$ on the output line 810. The OR inputs to gate $G_7$ are $G_{N-1}BAR$, line 804, and $P_{FN}BAR$, line 808. The NAND input to OR/NAND gate $G_7$ is $G_N BAR$ on line 806. NOR gate $G_8$ produces $P_{SN-1}$ on its output line 811. NOR gate $G_8$'s two inputs are $G_{N-1}$, line 809, and $P_{FN-1}BAR$, line 805. NOR gate $G_9$ produces $P_N'$ on its output 812. NOR gate $G_9$'s two inputs are $P_{FN-1}BAR$ and $P_{FN}BAR$. Inverters $G_{10}$, $G_{11}$ and $G_{12}$ are totally individually accessible inverters. Complex AND/NOR gate $G_{14}$ and NAND gate $G_{15}$ are individually accessible and include totally individually accessible input and outputs but for common input line 823. Line 823 is an input to NAND $G_{15}$ and to an AND input of gate $G_{14}$. Inverters $G_{17}$ and $G_{18}$ are totally individually accessible. NOR gate $G_{16}$ and complex OR/NAND gate $G_{19}$ are individually accessible and include totally individually accessible inputs and outputs but for common input line 835. Line 835 is an input to NOR gate $G_{16}$ and to an OR input of gate $G_{19}$. The output of NOR $G_8$, $P_{SN-1}$ goes directly to one input of EXCLUSIVE OR $G_{24}$ whose output 847 produces $S_{N-1}$. The two inputs to NOR $G_{13}$ are $G_N$ and $P_{FN}BAR$. The output of NOR $G_{13}$, $P_{SN}$ goes directly to one input of EXCLUSIVE OR $G_{25}$ whose output is 848 which is used to produce $S_N$. The carry input, CBAR, goes to one OR input of OR/NAND gates $G_{22}$ and $G_{23}$. The output of $G_{22}$ goes to the other input of EXCLUSIVE OR gate $G_{24}$. The output of OR/NAND gate $G_{23}$ is 846 and it goes to the other input of EXCLUSIVE OR $G_{25}$. The other two inputs to OR/NAND gate $G_{22}$ are individually accessible. NAND gate $G_{20}$ output 842 goes to the other OR input of OR/NAND gate $G_{23}$. One input of NAND gate $G_{20}$ is individually accessible, the other input is individually accessible and common to the AND input of AND/NOR gate $G_{21}$. The other two inputs to AND/NOR gate $G_{21}$ are individually accessible. The output 843 of gate $G_{21}$ goes to the NAND input of OR/NAND gate $G_{23}$. It should be noted that common, individually accessible gates could also be made individually accessible and not common. The adder of FIG. 8 is designed to provide all the logic necessary to implement up to a 32-bit adder with no additional logic required. Gates $G_1$ to $G_4$ generate the P and G terms. The implementation chosen provides a transistor stack height, number of series transistors, of two transistors maximum and a fanout of four maximum. This implementation in CMOS can be laid out in two rows of transistor pairs:

$G_1$ through $G_{15}$ in row 1 and
$G_{16}$ through $G_{25}$ in row 2.

This makes row 1 have 27 transistor pairs and row 2 have 28 transistor pairs. Connections 809 through 829 and 832 through 841 provide access to all the signals and the logic necessary to implement the carry-tree structure shown in FIG. 7 and provide access to logic driving the CBAR line shown on FIG. 8. Line CBAR in FIG. 8 for bits 0 through 15 is driven from a buffered form of $C_{IN}$BAR. The line CBAR in FIG. 8 for bits 16 through 31 is driven as illustrated in FIG. 9.

An equivalent functional design would be to make the signal on line 819 $P_{SN}$BAR. This could be done by making $G_{13}$ a NAND gate with inputs 806 and 807. The input to inverter $G_6$ would be line 808. In order to maintain the logic sense of output 848, $S_N$, gate $G_{25}$ would be an EXCLUSIVE NOR.

Figure 9:
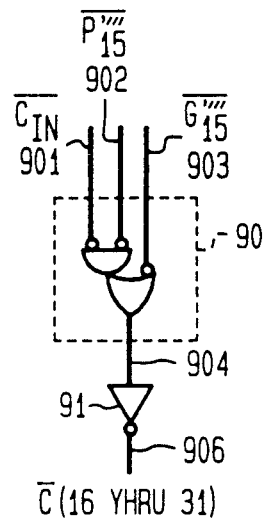
FIG. 9 illustrates the logic for generating the carry required into bits 16 through 31.
Figure 10:
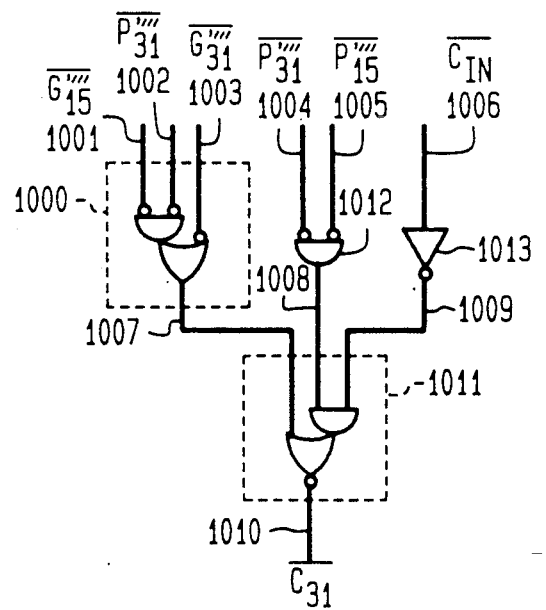
FIG. 10 illustrates the logic required to provide the carry-out of bit 31.

FIG. 9 shows how the carry is generated for the upper 16 bits of a 32-bit adder illustrated in FIGS. 16C and 16D, while FIG. 10 illustrates the circuitry for providing carry-out from bit 31 which is the last carry bit.

Specifically, FIG. 9 shows a logic circuit 90, illustrated in broken lines, comprised of an OR/NAND combination, the output of which is coupled over line 904 to inverter 91, from the output 906 of which CBAR (16-31) is obtained. To the input 901 of logic circuit 90 $C_{IN}$BAR is applied. To input 904 propagate term $P_{15}''''$BAR is applied. To input 903 generate term $G_{15}''''$BAR is applied. This carry-out signal provided by the circuitry of FIG. 10 is the signal which would be provided to the carry line for higher order bits in the event that an adder having greater than 32 bits were being implemented.

FIG. 10 is comprised of combinational logic circuits 1000, 1011, 1012 and 1013. Combinational logic circuit 1000 is comprised of an OR/NAND circuit the output of which 1007 is applied to one of the inputs of logic circuit 1011. Input 1001 of logic circuit 1000 receives generate term $G_{15}''''$BAR, while input 1002 receives propagate term $P_{31}''''$BAR. Input 1003 receives generate term $G_{31}''''$BAR. OR circuit 1012 has its output 1008 coupled to one of the inputs of logic circuit 1011. One of its inputs 1004 receives propagate term $P_{31}''''$BAR while the other input 1005 receives propagate term $P_{15}''''$BAR. A $C_{IN}$BAR input 1006 is coupled through inverter 1013 over line 1009 to the third input of logic circuit 1011. The output of logic circuit 1011 is coupled over line 1010 as $C_{31}$BAR. Alternatively, the carry-in for bits higher than bit 31 could be generated by P and G terms in order to keep the number of delays to a minimum such as was done for the second 16 bits in the implementation illustrated.

Figure 11:
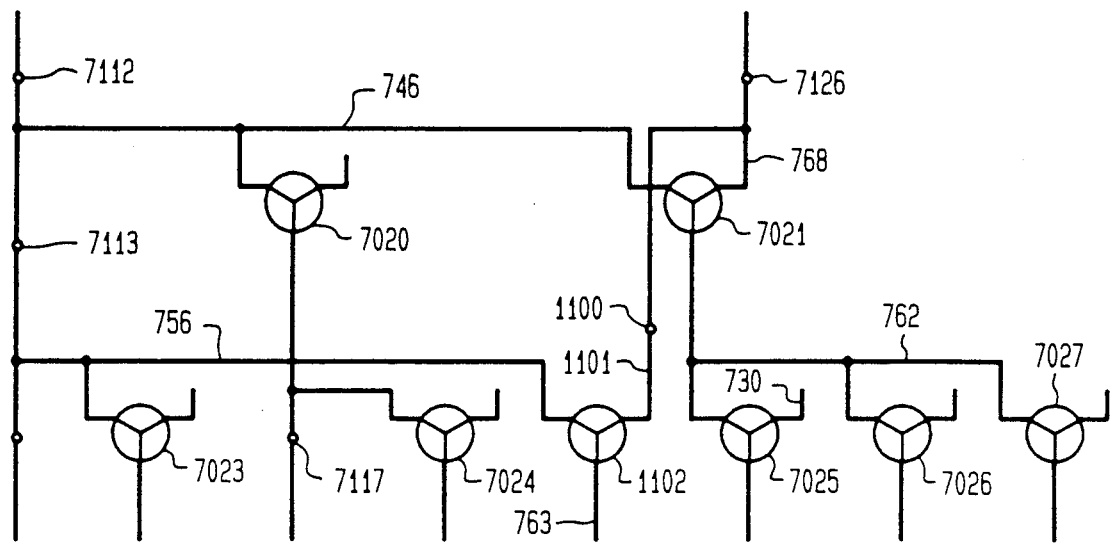
FIG. 11 illustrates an improved carry-tree circuit implementation.

FIG. 11 shows an improvement to that shown in FIG. 7. The maximum loading in FIG. 7 is a fanout of four for gate 7021. The improvement in FIG. 11 reduces the fanout to a maximum of three. Numbering in FIG. 11 is the same as in FIG. 7 for corresponding unchanged portions. Changed portions have new line and device designations. Device inverter 7120 in FIG. 7 is eliminated in FIG. 11. This reduces the load on line 762 to three loads, hence the maximum fanout on carry gate 7021 is a fanout of three. Line 768 in FIG. 7 has only one load, carry gate 7021. In FIG. 11 it has two loads, the input to carry gate 7021 and the input to inverter 1100. The output of inverter 1100 drive line 1101 which is the input to a new carry gate 1102 whose output drives line 763. The other input to carry gate 1102 is from inverter 7113 whose output is line 756. This increases the loading on inverter 7113 from two in FIG. 7 to three in FIG. 11. Thus, it can be seen that the improvement reduces the maximum fanout in the carry-tree structure from a fanout of four to a fanout of three but requires one additional carry-tree gate.

Figure 12:
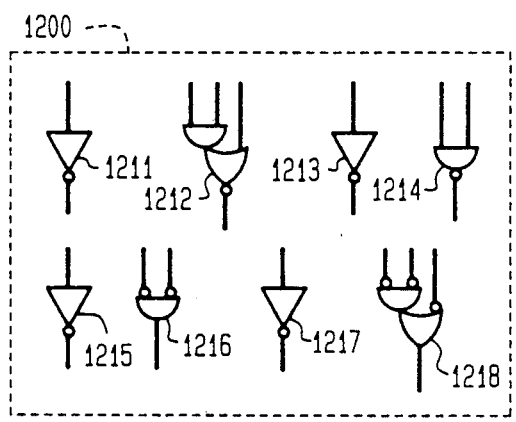
FIG. 12 illustrates the logic required for a 1-bit carry-tree cell.

FIG. 12 shows a 1-bit carry-tree cell, cell 1200. This cell contains four totally individually accessible inverters 1211, 1213, 1215 and 1217 and one totally individually accessible AND/NOR gate 1212, one totally individually accessible NAND gate 1214, one totally individually accessible NOR gate 1216, and one totally individually accessible OR/NAND gate 1218. This cell contains all the logic necessary for a 1-bit carry-tree structure.

Figure 13:
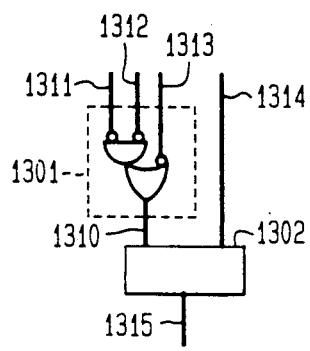
FIG. 13 illustrates the logic for a 1-bit adder output cell.

FIG. 13 contains a 1-bit cell which can be used for the output portion of an adder. This cell contains two gates, 1301 which is a OR/NAND gate with three individually accessible input lines 1311, 1312 to the OR portion and 1313 to the NAND portion of OR/NAND gate 1301. The output of 1301 is on line 1310 which goes to the output EXCLUSIVE OR gate or EXCLUSIVE NOR gate 1302. The other input to the output EXCLUSIVE OR gate or EXCLUSIVE NOR gate 1302 is individually accessible input line 1314. The output of 1302 is line 1315. 1302 could be either an EXCLUSIVE OR gate or an EXCLUSIVE NOR gate depending on the polarity or sense chosen for the signal on line 1314. For example, assuming that the sense of the input lines 1311 through 1314 are all negative and the desired sense of the output signal 1315 were to be positive, then gate 1302 would be an EXCLUSIVE NOR gate. If, however, the sense of input 1314 were inverted, then an EXCLUSIVE OR gate would be used for gate 1302 to again produce a positive sense output on 1315.

Figure 14:
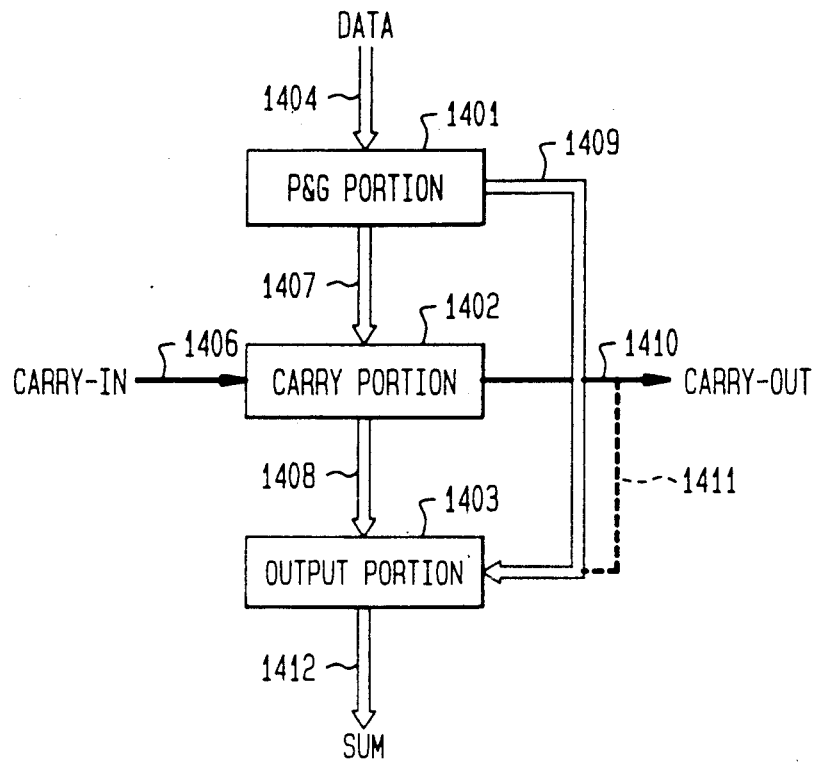
FIG. 14 illustrates in block diagram form one structural implementation of the invention.

FIG. 14 is a block diagram of the functional blocks of an individual cell for use in implementing a multicell adder. Data input is provided through input 1404 to P and G portion 1401, where P and G terms are generated and provided to a carry portion 1402 through data path 1407 and to an output portion 1403 through data path 1409. A carry-in signal is provided to the carry portion through data path 1406 and a carry-out is provided from the carry portion through data path 1410. The carry signal provided from carry portion 1402 through data path 1408 is received at output portion 1403, where a sum output 1412 is provided. The carry-out could be provided to the output portion through 1411.

Figure 15:
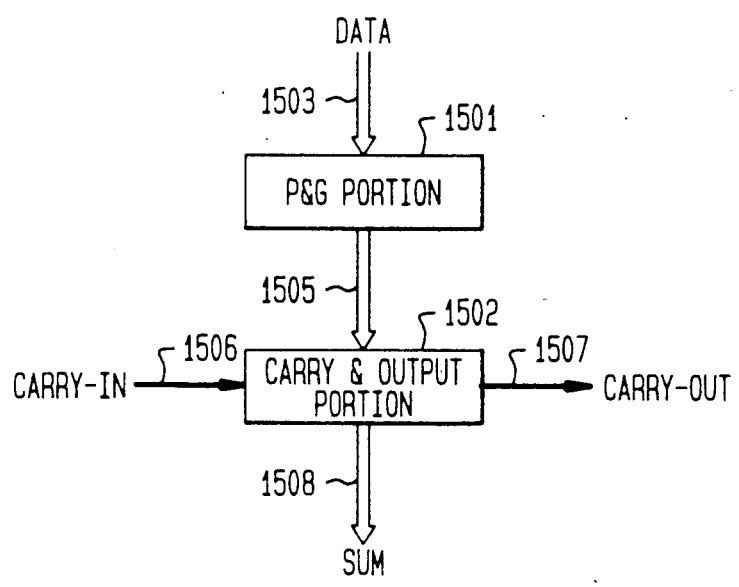
FIG. 15 illustrates in block diagram form another structural implementation of the invention.

FIG. 15 illustrates a simplified block diagram illustrating that data input 1503 is provided to P and G portion 1501. P and G terms are provided through data path 1505 from the P and G portion to carry and output portion 1502. A carry-in signal is provided through data path 1506 to the carry and output portion, and an output is provided through sum output 1508. A carry-out through the highest order bit level is provided through data path 1507.

Figure 16B:
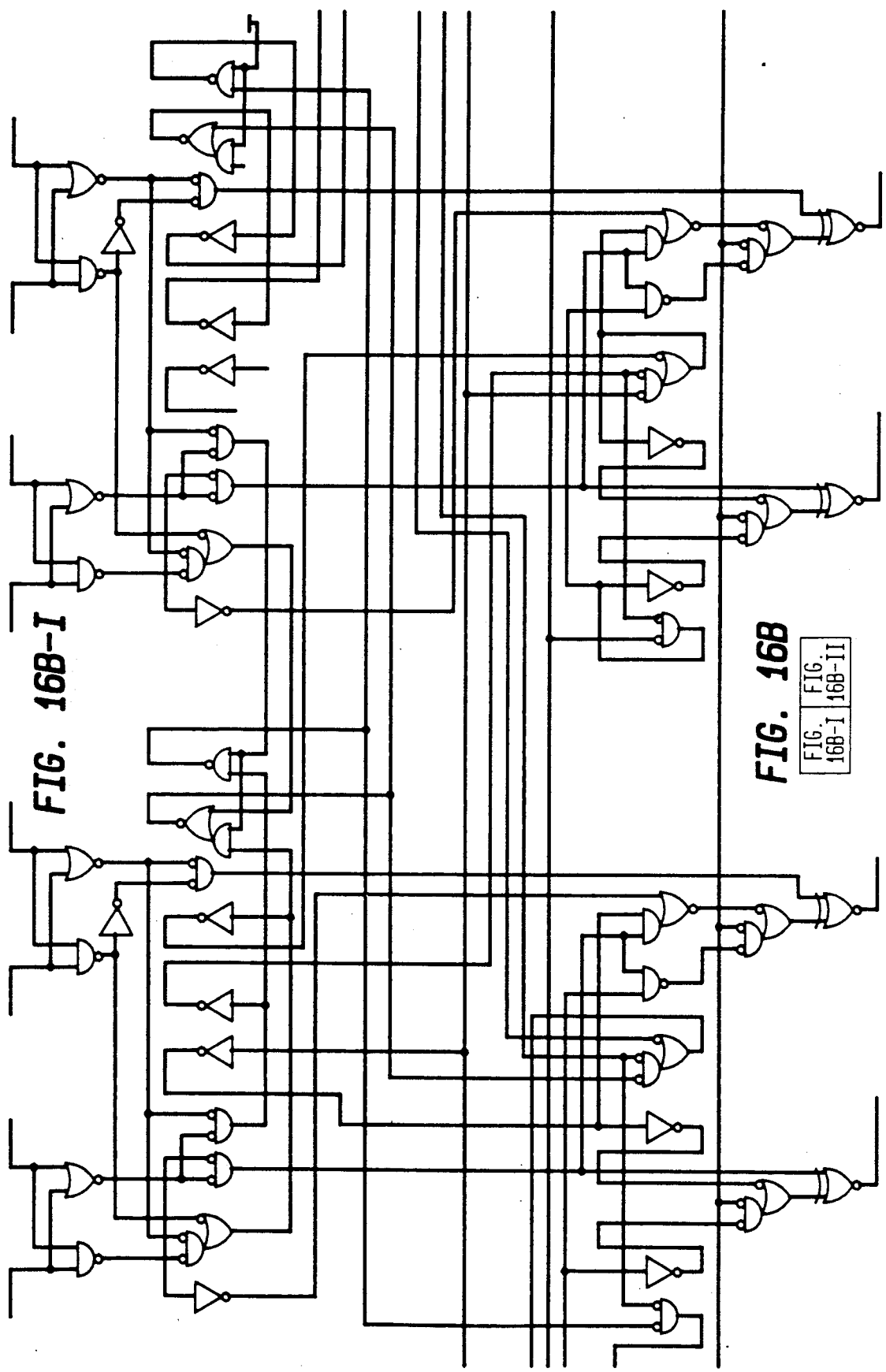

FIGS. 16A, B, C and D illustrate a full logic schematic of a 32-bit adder fabricated from 16 repeats of the 2-bit cell structure illustrated in FIG. 8. The interconnect illustrated in FIGS. 16A-D implements the carry structure illustrated in FIG. 7. The maximum fanout of four provided in FIG. 16 could be modified as illustrated in FIG. 11 to reduce the maximum fanout in the carry-tree structure to three.

Counting all of the gates in the foregoing implementation as having one gate delay except for the EXCLUSIVE OR which has two gate delays, the total delays encountered in the circuit is as follows:

CBAR to S—3 delays maximum
carry logic delay—6 delays maximum
$C_{IN}$BAR to S—5 delays maximum
P and G logic—1 delay maximum Thus, since CBAR to S, carry logic delay and P and G logic can be serially implemented, the maximum delay which can be encountered in the use of the adder described is 10 delays.

The number of bits combined at each stage in the carry-tree logic is optimized when two inputs are provided. Notwithstanding that this results in a larger number of stages required to implement a circuit, a three input carry-tree implementation, for instance, results in excessive stack height. Stack height is the maximum number of series transistors between the output and a power supply. The additional stack height results in a slower time constant, due to the increased resistance by a factor of 3 to 2.

The signals $C_{IN}$BAR and $C_{31}$BAR are shown as an example implementation. The signal $C_{IN}$ could be used instead of $C_{IN}$BAR by adding an inverter in FIG. 9 to produce $C_{IN}$BAR on 901 or deleting inverter 1013 in FIG. 10 and driving 1009 directly with $C_{IN}$. $C_{31}$ could be produced by connecting 1010 of FIG. 10 to an inverter whose output would then become $C_{31}$.

Although the present invention has been described and illustrated in detail, it is to be clearly understood that the same is by way of illustration and example only, and is not to be taken by way of limitation. The spirit and scope of the present invention are to be limited only by the terms of the appended claims.

I claim:

1. An adder for adding first and second digital code signals comprising a plurality of adder cells each of which contains circuitry for implementing one bit of said adder and includes a front end portion, a carry propagation portion and an output portion, each of said adder cells being interconnected so that their front end portions are coupled to receive respective bit signals of said first digital code signal and respective bit signals of said second digital code signal, said front end portions including means for generating propagate and generate term signals for the respective bit positions of said digital code signals;

each of said carry propagation portions having a plurality of inputs coupled to receive from said front end portion the propagate and generate term signals for said respective bit positions, and comprising carry propagation logic circuits and inverter circuits interconnected in a tree structure between said plurality of inputs and a plurality of outputs and providing at said plurality of outputs respective carry propagation signals associated with said respective bit positions; and each of said output portions being coupled to said carry propagation portions and to said front end portions, and including means for logically combining propagate and generate signals with carry propagation signals to derive a summation output code representative of the sum of said first and second digital code signals.

2. An adder according to claim 1, wherein the maximum circuit path delay through said adder via said front end portions, said carry propagation portions and said output portions is ten circuits.

3. An adder according to claim 1, wherein said carry propagation logic circuits are interconnected such that the maximum loading of any carry propagation logic circuit by other carry propagation logic circuits connected thereto is three and the maximum circuit delay in any path between the inputs and outputs of said carry propagation portion is six circuits.

4. An adder according to claim 3, wherein said adder comprises a 32 bit adder in which output portions for bits 0-15 are coupled to receive carry propagation signals from said carry propagation portions and a carry-in signal and output portions for bits 16-31 are coupled to receive carry propagation signals from said carry propagation portions and a carry signal from bit 15.

5. An adder according to claim 1, wherein the carry propagation portion of a respective adder cell comprises a first NOR gate having first and second inputs coupled to receive respective ones of said propagate signals and a first OR/NAND gate having first and second inputs coupled to receive respective ones of said generate signals and a third input coupled to one of the inputs of said first NOR gate, the outputs of said first NOR gate and said first OR/NAND gate being coupled to logically combining means of selected ones of said output portions.

6. An adder according to claim 5, wherein said logically combining means of a respective output portion includes a second OR/NAND gate having first and second inputs coupled to receive propagate and generate signals from selected ones of said front end portions, a third input coupled to receive a carry signal, and an output, and a first exclusive NOR gate having a first input coupled to the output of said second OR/NAND gate and a second input coupled to a front end portion, and an output from which a SUM term signal is derived.

7. An adder according to claim 5, wherein said logically combining means of a respective output portion includes a second OR/NAND gate having first and second inputs coupled to receive propagate and generate signals from selected ones of said front end portions, a third input coupled to receive a carry signal, and an output, and a first exclusive OR gate having a first input coupled to the output of said second OR/NAND gate and a second input coupled to a front end portion, and an output from which a SUM term signal is derived.

8. An adder for adding first and second digital code signals comprising:

a front end portion having a first plurality of input terminals to which respective bit signals of said first digital code signal are applied and a second plurality of input terminals to which respective bit signals of said second digital code signal are applied, said front end portion including means for generating propagate and generate term signals for the respective bit positions of said digital code signals;

a carry propagation portion having a plurality of inputs coupled to receive from said front end portion the propagate and generate term signals for respective bit positions, said carry propagation portion comprising carry propagation logic circuits and inverter circuits interconnected in a tree structure between said plurality of inputs and a plurality of outputs and providing at said plurality of outputs respective carry propagation signals associated with said respective bit positions; and an output portion, coupled to said carry propagation portion and to said front end portion, and including means for logically combining propagate and generate signals with carry propagation signals to derive a summation output code representative of the sum of said first and second digital code signals.

9. An adder according to claim 8, wherein said carry propagation logic circuits are interconnected such that the maximum loading of any carry propagation logic circuit by other carry propagation logic circuits connected thereto is three and the maximum circuit delay in any path between the inputs and outputs of said carry propagation portion is six circuit delays.

10. An x-bit adder cell through which an n(x)-bit adder having a tree-structured carry is configured by interconnecting n repeats of said x-bit cell structure, said cell comprising:

first means for receiving x-bit input signals and generating therefrom propagate (P) and generate (G) term signals associated with said x-bits; and second means for receiving said propagate and generate term signals from said first means and a carry signal (CBAR) and producing therefrom x-bit sum signals (S), said second means including a carry propagation circuit formed of a plurality of gate circuits and inverter circuits interconnected with one another to form a carry tree structure.

11. An x-bit adder cell according to claim 10, wherein said x-bit cell is a two-bit cell and said x-bit input signals for said cell comprise immediately successive bit signals $A_N$ and $A_{N-1}$ and $B_N$ and $B_{N-1}$, for first and second digital input signals A and B, respectively, and said first means generates propagate term signals $P_{FN-1}BAR$ and $P_{FN}BAR$ and generate term signals $G_{N-1}BAR$ and $G_N BAR$, and said second means generates propagate term signals $P_{SN-1}$, $P_{SN}$, and $P_N$, and generate term signals $G_{N-1}$, $G_{n'}$, in the course of generate a further carry signal and said x-bit sum signals.

12. An x-bit adder cell according to claim 1, wherein said second means includes means for providing individual access to said propagate and generate term signals $G_N$ and $P_N$.

13. An x-bit adder cell according to claim 1, wherein said plurality of carry tree gate circuits and inverter circuits are comprised of inverting CMOS logic and are interconnected such that the maximum loading of any carry tree gate circuit by other carry tree gate circuits connected thereto is three and the maximum circuit delay in any path said carry propagation circuit is six circuit delays.

14. An x-bit adder cell according to claim 13, wherein a carry tree gate circuit comprises:

a first OR/NAND gate providing an OR/NAND function, said first OR/NAND gate being connected to said first means to receive said $G_{N-1}BAR$ and $P_{FN}BAR$ term signals at the OR inputs and to receive said $G_N BAR$ signal at a NAND input, and including means for providing individual access to the output of said first OR/NAND gate.

15. An x-bit adder cell according to claim 14, wherein said second means further comprises a first output portion and a second output portion, each of said output portions comprising an OR/NAND gate having a first OR input connected to receive said carry signal (CBAR) and having an output connected to a first input of an output gate for generating said x-bit sum signals.

16. An x-bit adder cell according to claim 15, wherein said output gate comprises an EXCLUSIVE OR gate.

17. An x-bit adder cell according to claim 16, wherein said second means further includes a first NOR gate and a first inverter, wherein said $P_{FN}BAR$ term signal is provided to a first input to said first NOR gate, said $g_N BAR$ term signal is provided to an input of said first inverter, an output of the first inverter is provided to a second input to the first NOR gate, and an output of the first NOR gate provides the term signal $P_{SN}$ to the output gate of said second output portion at a second input of said EXCLUSIVE OR gate.

18. An x-bit adder cell according to claim 15, wherein said output gate comprises an EXCLUSIVE NOR gate.

19. An x-bit adder cell according to claim 15, wherein said $P_{FN-1}BAR$ and said $P_{FN}BAR$ term signals are provided to a first and a second input of a first NOR gate in said second means, and including means for providing individual access to an output of said first NOR gate.

20. An x-bit adder cell according to claim 19, wherein said second means further comprises a first NAND gate having an output connected to a second OR input of the OR/NAND gate of said second output portion.

21. An x-bit adder cell according to claim 15, wherein said second means further comprises a second OR/NAND gate having a first and a second OR input and a NAND input having an individually accessible output, said first OR input and said NAND input being individually accessible, and a first NOR gate having an individually accessible first input and an individually accessible output, and having a second input connected to the second OR input of said second OR/NAND gate, and wherein the connection of the first NOR input and the second OR input of said second OR/NAND gate is individually accessible.

22. An x-bit adder cell according to claim 21, wherein said second means further comprises a first AND/NOR gate having an output, a first and a second AND input and a NOR input, the second AND input and the NOR input of said second AND/NOR gate being individually accessible, and a first NAND gate having a first and a second NAND input and a NAND output, said NAND output connected to the second OR input of the OR/NAND gate of said second output portion of said second means, said first NAND input being individually accessible, and said second NAND input having an individually accessible connection to the first AND input of said first AND/NOR gate, and wherein the output of said first AND/NOR gate is connected to the NAND input of the OR/NAND gate of the second output portion of said second means.

23. An x-bit adder cell according to claim 22, wherein said second means further comprises a second NAND gate having a first and a second input and an output, the first input and the output being individually accessible, and a second AND/NOR gate having an output and a first and a second AND input, the first AND input and the output being individually accessible, and the second NAND input of said second NAND gate having an individually accessible connection to the second AND input of said second AND/NOR gate.

24. An x-bit adder cell according to claim 23, wherein said second means further comprises first, second and third inverters having individually accessible inputs and outputs.

25. An x-bit adder cell according to claim 24, wherein said second means further comprises a fourth inverter having an individually accessible input and an individually accessible output.

26. An x-bit adder cell according to claim 25, wherein said second means further comprises a fifth inverter having an individually accessible input and an individually accessible output.

27. An n-bit adder cell through which an m-bit adder having a tree-structured carry is configured by interconnecting m/n repeats of said n-bit cell structure, said cell comprising:
first means for receiving n-bit input signals and generating therefrom propagate (P) and generate (G) term signals associated with said n-bits; and
second means for receiving said propagate and generate term signals from said first means and a carry signal (CBAR) and producing therefrom n-bit sum signals (S), said second means including a carry propagation circuit formed of a plurality of gate circuits and individually accessible inverter circuits, interconnected with one another to form a carry tree structure.

28. An n-bit adder cell according to claim 27, wherein an individually accessible carry-tree gate circuit comprises, a first AND/NOR gate having a first AND input and a second AND input, a NOR input and an output, said first AND input, said NOR input and said output being individually accessible, a first NAND gate having a first input and a second input and an output, said first input and said output being individually accessible, and individually accessible node to which said second input and the second AND input of said AND/NOR gate are connected.

29. An n-bit adder cell according to claim 28, wherein said plurality of inverter circuits includes first, second, third and fourth totally individually accessible inverter circuits.

30. An n-bit adder cell according to claim 29, wherein said plurality of inverter circuits further includes a fifth totally individually accessible inverter.

31. An n-bit adder cell according to claim 30, wherein said n-bit cell is a two-bit cell and said n-bit input signals for said cell comprise immediately successive bit signals $A_N$ and $A_{N-1}$ and $B_N$ and $B_{N-1}$, for first and second digital input signals A and B, respectively, and said first means generates propagate term signals $P_{FN-1}$BNAR and $P_{FN}$BAR and generate term signals $G_{N-1}$BAR and $G_N$BAR, and said second means generates propagate term signals $P_{SN-1}$, $P_{SN}$, and $P_N$, and generate term signals $G_{N-1}$, $G_N$, in the course of generating a further carry signal and said n-bit sum signals.

32. An n-bit adder cell according to claim 31, wherein said second means further includes a sixth inverter circuit having a $G_{N-1}$BAR generate term signal coupled to its input and including an individually accessible node to which its output is connected.

33. An n-bit adder cell according to claim 27, wherein said cell comprises first, second third and fourth OR/NAND gates, a first, second, third and fourth NOR gates, a first and second NAND gates, first and second EXCLUSIVE OR gates, a first and second AND/NOR gates, first, second, third, fourth and fifth individually accessible inverter circuits, sixth and seventh inverter circuits, and wherein
said $G_{N-1}$BAR and $P_{FN}$BAR term signals are coupled to respective OR inputs of said first OR/NAND gate and said $G_N$BAR term signal is coupled to a NAND input of said first OR/NAND gate, and wherein an output of said first OR/NAND gate is individually accessible,
said $G_{N-1}$BAR term signal is coupled to an input of said sixth inverter, and an output of said sixth inverter is coupled to a first input of said first NOR gate and to a node which is individually accessible,
said $G_N$BAR term signal is coupled to an input of said seventh inverter and an output of said seventh inverter is coupled to a first input of said second NOR gate,
said $P_{FN-1}$BAR term signal is coupled to a first input of said third NOR gate and to a second input of said first NOR gate, and said $P_{FN}$BAR term signal is coupled to a second input of said second NOR gate and to a second input of said third NOR gate, the output of said third NOR gate being individually accessible,
said first AND/NOR gate having a first AND input and a second AND input, a NOR input and an output, said first AND input, said NOR input and said output being individually accessible,
said first NAND gate having a first and a second input and an output, said first input and said output being individually accessible, and said second input being connected to a second AND input of said first AND/NOR gate at an individually accessible node, said second OR/NAND gate having a first OR input and a second OR/ input, a NAND input and an output, said first OR input, said NAND input and said output being individually accessible,
said fourth NOR gate having a first input and a second input and an output, said first input and said output being individually accessible and said second input being connected to the second OR input of said second OR/NAND gate at an individually accessible node,
said third OR/NAND gate having a first OR input and a second OR input and a NAND input and an output, said first OR input and said NAND input being individually accessible, said second OR input connected to a carry line CBAR,
said first EXCLUSIVE OR gate having a first input and a second input and an output, the first input being connected to the output of said third OR/NAND gate and the second input being connected to the output of said first NOR gate, the output of said first EXCLUSIVE OR gate providing a SUM $N-1$ term signal, said fourth OR/NAND gate having a first OR input and a second OR input and a NAND input and an output, said second OR input being connected to said carry line CBAR,
said second NAND gate having a first input and a second input and an output, said first input being individually accessible and said output being connected to the first input of said fourth OR/NAND gate,
said second AND/OR gate having a first AND input and a second AND input and a NOR input and an output, said second AND input and an output, said second AND input and said NOR input being individually accessible, and said first AND input being connected to said second NAND input of said second NAND gate at an individually accessible node, the output of said second AND/NOR gate being connected to the NAND input of said fourth OR/NAND gate, and said second EXCLUSIVE OR gate having a first input and a second input and an output, said first input being connected to the output of said fourth OR/NAND gate, said second input being connected to the output of said second NOR gate and the output of said second EXCLUSIVE OR providing a SUM$_N$ term signal.

34. A method of implementing an m-bit adder having a tree-structured carry comprising the steps of:

(a) providing, in a semiconductor substrate, a plurality of n-bit adder cells, each adder cell having a front end portion having a first plurality of input terminals to which respective bit signals of a first digital code signal are to be applied and a second plurality of input terminals to which respective bit signals of a second digital code signal are to be applied, said front end portion including means for generating propagate and generate term signals for the respective bit positions of said digital code signals, a carry propagation portion having a plurality of inputs coupled to receive from said front end portion the propagate and generate term signals for said respective bit positions, said carry propagation portion comprising carry propagation logic circuits and inverter circuits capable of being interconnected in a tree structure between the plurality of inputs of the carry propagation portions of said plurality of adder cells and a plurality of outputs thereof and providing at said plurality of outputs respective carry propagation signals associated with said respective bit positions, and an output portion, coupled to said carry propagation portion and to said front end portion, and including means for logically combining propagate and generate signals with carry propagation signals to derive summation output bit values representative of the sum of the respective bit values for said bits positions of said first and second digital code signals;

(b) interconnecting selected ones of said carry propagation logic circuits and said inverter circuits of said adder cells in a tree structure between the plurality of inputs and the plurality of outputs of said carry propagation portions, so as to provide at outputs thereof said respective carry propagation signals associated with said respective bit positions, whereby the output portions of said plurality of adder cells produce summation codes representative of the sum of said first and second code signals.

35. A method according to claim 34, wherein said carry propagation logic circuits of a respective adder cell include a first NOR gate having first and second inputs coupled to receive respective ones of said propagate signals and a first OR/NAND gate having first and second inputs coupled to receive respective ones of said generate signals and a third input coupled to one of the inputs of said first NOR gate, and step (b) includes the step of interconnecting outputs of said first NOR gate and said first OR/NAND gate being coupled to selected output portions of said plurality of adder cells.

36. A method according to claim 35, wherein a respective output portion includes a second NOR/NAND gate having first and second inputs, and step (b) comprises coupling said first and second inputs to receive propagate and generate signals from selected front end portions of said plurality of adder cells, and wherein said output portion further includes a third input, and step (b) includes coupling said third input to receive a carry signal, said NOR/NAND gate having an output, and wherein said respective output portion includes a first exclusive NOR gate having a first input, and wherein step (b) further includes coupling the first input of said exclusive NOR gate to the output of said second NOR/NAND gate, and a second input, and wherein step (b) comprises coupling the second input of said first exclusive NOR gate to a front end portion, said first exclusive NOR gate further including an output, and wherein step (b) comprises deriving a SUM term signal for a respective bit position from the output of said second NOR/NAND gate.

37. A method according to claim 35, wherein a respective output portion includes a second OR/NAND gate having first and second inputs, and step (b) comprises coupling said first and second inputs to receive propagate and generate signals from selected front end portions of said plurality of adder cells, and wherein said output portion further includes a third input, and step (b) includes coupling said third input to receive a carry signal, said OR/NAND gate having an output, and wherein said respective output portion includes a first exclusive OR gate having a first input, and wherein step (b) further includes coupling the first input of said exclusive OR gate to the output of said second OR/NAND gate, and a second input, and wherein step (b) comprises coupling the second input of said first exclusive OR gate to a front end portion, said first exclusive OR gate further including an output, and wherein step (b) comprises deriving a SUM term signal for a respective bit position from the output of said second OR/NAND gate.

* * * * *